(12) United States Patent
Ogawa et al.

(10) Patent No.: US 12,545,756 B2
(45) Date of Patent: Feb. 10, 2026

(54) CURABLE RESIN COMPOSITION, MOLDED ARTICLE AND METHOD FOR PRODUCING SAME

(71) Applicant: MITSUBISHI GAS CHEMICAL COMPANY, INC., Tokyo (JP)

(72) Inventors: Noriyoshi Ogawa, Ibaraki (JP); Shun Ishikawa, Ibaraki (JP)

(73) Assignee: MITSUBISHI GAS CHEMICAL COMPANY, INC., Tokyo (JP)

( * ) Notice: Subject to any disclaimer, the term of this patent is extended or adjusted under 35 U.S.C. 154(b) by 563 days.

(21) Appl. No.: 17/925,352

(22) PCT Filed: May 20, 2021

(86) PCT No.: PCT/JP2021/019100
§ 371 (c)(1),
(2) Date: Nov. 15, 2022

(87) PCT Pub. No.: WO2021/241378
PCT Pub. Date: Dec. 2, 2021

(65) Prior Publication Data
US 2023/0174700 A1 Jun. 8, 2023

(30) Foreign Application Priority Data

May 27, 2020 (JP) .................................. 2020-092258
Oct. 14, 2020 (JP) .................................. 2020-173028

(51) Int. Cl.
| | |
|---|---|
| *C08F 290/06* | (2006.01) |
| *C08F 212/08* | (2006.01) |
| *C08F 283/02* | (2006.01) |
| *C08G 64/04* | (2006.01) |
| *C08G 64/12* | (2006.01) |
| *C08G 64/14* | (2006.01) |
| *C08G 64/22* | (2006.01) |
| *C08G 64/24* | (2006.01) |
| *C08G 64/42* | (2006.01) |
| *C08L 69/00* | (2006.01) |

(52) U.S. Cl.
CPC ........ *C08F 290/061* (2013.01); *C08F 212/08* (2013.01); *C08F 283/02* (2013.01); *C08F 290/06* (2013.01); *C08G 64/04* (2013.01); *C08G 64/045* (2013.01); *C08G 64/12* (2013.01); *C08G 64/14* (2013.01); *C08G 64/22* (2013.01); *C08G 64/24* (2013.01); *C08G 64/42* (2013.01); *C08L 69/00* (2013.01); *C08F 2810/40* (2013.01); *C08G 2261/128* (2013.01); *C08G 2261/1642* (2013.01); *C08L 2201/10* (2013.01); *C08L 2203/30* (2013.01)

(58) Field of Classification Search
CPC .............. C08F 212/08; C08F 290/061; C08G 2261/128; C08G 77/448; C08G 64/045; C08L 69/00
See application file for complete search history.

(56) References Cited

U.S. PATENT DOCUMENTS

| | | | | |
|---|---|---|---|---|
| 4,310,642 A | * | 1/1982 | Margotte | ............ C08F 290/061 |
| | | | | 528/370 |
| 4,888,401 A | | 12/1989 | Kawaki et al. | |
| 6,096,852 A | * | 8/2000 | Lensvelt | ................ C08K 5/134 |
| | | | | 528/196 |
| 10,385,206 B2 | | 8/2019 | Miyake et al. | |
| 2007/0165303 A1 | * | 7/2007 | Osawa | ..................... G02B 3/08 |
| | | | | 359/457 |
| 2017/0335100 A1 | | 11/2017 | Miyake et al. | |

FOREIGN PATENT DOCUMENTS

| | | |
|---|---|---|
| CN | 107109043 A | 8/2017 |
| EP | 4 050 050 A1 | 8/2022 |
| JP | 48-25076 B1 | 7/1973 |

(Continued)

OTHER PUBLICATIONS

Office Action dated Dec. 28, 2024, issued in family member Chinese patent application No. 202180037359.4 with English language translation thereof.

(Continued)

*Primary Examiner* — Heidi R Kelley
*Assistant Examiner* — Surbhi M Du
(74) *Attorney, Agent, or Firm* — GREENBLUM & BERNSTEIN P.L.C.

(57) ABSTRACT

A curable resin composition contains a polycarbonate resin and a styrenic monomer, the polycarbonate resin comprising a terminal structure that has an unsaturated group represented by the following Formula (1):

$$-Y-\underset{(R_3)_b}{\underset{|}{\bigcirc}}[R_2-Z-R_1-A]_a \quad (1)$$

and a constitutional unit represented by the following Formula (2):

$$\left[ -O-\underset{(R_4)_c}{\underset{|}{\bigcirc}}-X-\underset{(R_4)_c}{\underset{|}{\bigcirc}}-O-\underset{\|}{\overset{O}{C}}- \right] \quad (2)$$

17 Claims, No Drawings

(56) References Cited

FOREIGN PATENT DOCUMENTS

| JP | 63-159415 | A | 7/1988 |
|----|-----------|---|--------|
| JP | 6-1813 | A | 1/1994 |
| JP | 8-127667 | A | 5/1996 |
| JP | 2001-139791 | A | 5/2001 |
| JP | 2005-139261 | A | 6/2005 |
| WO | 2021/079893 | A1 | 4/2021 |

OTHER PUBLICATIONS

International Search Report and Written Opinion of the International Searching Authority issued in International Patent Application No. PCT/JP2021/019100, dated Jul. 13, 2021, along with an English translation thereof.
International Preliminary Report on Patentability issued in International Patent Application No. PCT/JP2021/019100, dated Nov. 17, 2022, along with an English translation thereof.
Extended European Search Report issued Oct. 30, 2023 in corresponding European family member application No. 21813665.3.

* cited by examiner

CURABLE RESIN COMPOSITION, MOLDED ARTICLE AND METHOD FOR PRODUCING SAME

TECHNICAL FIELD

The present invention relates to a curable resin composition, a molded article, and a method for producing the molded article.

BACKGROUND ART

Polycarbonate resins are excellent in impact resistance, heat resistance, electrical insulation, dimensional stability, and the like, and are therefore widely used for applications such as lenses, cover members of touch panels, and housings of devices. However, there is room for improvement in optical properties of the polycarbonate resins, such as high birefringence.

As a method for improving the optical properties, a method of modifying a polycarbonate (PC) resin is known. For example, Patent Literature 1 describes a method for producing a modified poly carbonate-based resin composition characterized by melt-kneading a mixture containing a polycarbonate resin having a Tg of 170° C. or higher (A), an aromatic vinyl monomer (B), and a radical polymerization initiator (C).

Patent Literature 1 describes that the photoelastic coefficient can be decreased by mixing a material having a negative intrinsic birefringence index such as polystyrene with a polycarbonate resin, which has a large photoelastic coefficient. Patent Literature 1 also describes that the above-described production method can solve the problem that transparency and secondary processability are insufficient while decreasing the photoelastic coefficient.

Note that, it is described that, in the modified polycarbonate-based resin composition, the aromatic vinyl monomer (B) can be present in a state of being bonded to the polycarbonate resin as a polymer of several to several tens of monomer molecules or as a monomer, or in a state of being mixed in the composition as a polymer of several to several tens of monomer molecules or as a monomer by melt kneading. It is also described that the aromatic vinyl monomer (B) is preferably a styrenic monomer.

PRIOR ART DOCUMENTS

Patent Document

Patent Literature 1: Japanese Patent Publication No. 2001-139791

SUMMARY OF INVENTION

Problems to be Solved by the Invention

However, it has been found that the modified polycarbonate-based resin composition described in Patent Literature 1 does not necessarily have high compatibility between the polycarbonate resin and the styrenic monomer or the polymer thereof, and may not have sufficient transparency and impact-resistance strength.

Therefore, the present invention provides a curable resin composition from which a molded article having excellent transparency and impact-resistance strength is obtained.

Means for Solving the Problems

The present inventors have conducted intensive studies in order to solve the above problem. The present inventors have thereby found that the problem can be solved by using a specified polycarbonate resin and a specified styrenic monomer, and have completed the present invention. That is, the present invention includes the following aspects.

[1] A curable resin composition containing a polycarbonate resin and a styrenic monomer, the polycarbonate resin containing a terminal structure having an unsaturated group represented by the following Formula (1):

$$-Y-\underset{(R_3)_b}{\underset{|}{\text{C}_6\text{H}_{4-b}}}-[R_2-Z-R_1-A]_a \quad (1)$$

wherein A is a vinyl group, an isopropenyl group, a styryl group, or a methine group, $R_1$ and $R_2$ are each independently selected from the group consisting of a single bond and a substituted or unsubstituted alkylene group having 1 to 20 carbon atoms, $R_3$ is each independently selected from the group consisting of a hydrogen atom, a substituted or unsubstituted alkyl group having 1 to 20 carbon atoms, a substituted or unsubstituted alkoxy group having 1 to 10 carbon atoms, a substituted or unsubstituted aryl group having 6 to 12 carbon atoms, and a substituted or unsubstituted heteroaryl group having 5 to 12 elements, Z is each independently selected from the group consisting of a single bond, an ether group, a carbonyl group, and an ester group, a is an integer of 1 to 3, b is an integer of 2 to 4, and Y is an ether group or an ester group; and a constitutional unit represented by the following Formula (2):

$$\left[-O-\underset{(R_4)_c}{\underset{|}{\text{C}_6\text{H}_{4-c}}}-X-\underset{(R_4)_c}{\underset{|}{\text{C}_6\text{H}_{4-c}}}-O-\overset{O}{\underset{\|}{C}}-\right] \quad (2)$$

wherein $R_4$ is each independently selected from the group consisting of a substituted or unsubstituted alkyl group having 1 to 20 carbon atoms, a substituted or unsubstituted aryl group having 6 to 12 carbon atoms, a substituted or unsubstituted alkoxy group having 1 to 5 carbon atoms, and a substituted or unsubstituted aralkyl group having 7 to 17 carbon atoms, c is each independently an integer of 0 to 4, X is selected from the group consisting of $-C(R_5)(R_6)-$, $-S-$, $-(CH_2)_d-$, $-O-$, $-SO-$, $-CO-$, $-SO_2-$, and groups represented by the following Formulae (3) to (6):

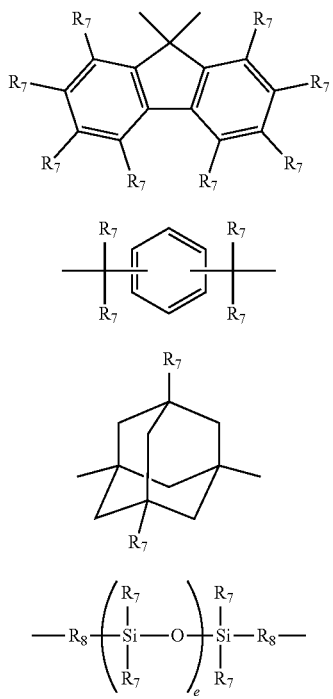

(3)

(4)

(5)

(6)

wherein $R_5$ and $R_6$ are each independently a hydrogen atom, a fluorine atom, a chlorine atom, a bromine atom, an iodine atom, a substituted or unsubstituted alkyl group having 1 to 20 carbon atoms, a substituted or unsubstituted alkoxy group having 1 to 5 carbon atoms, a substituted or unsubstituted aryl group having 6 to 12 carbon atoms, or a carbocyclic group having 5 to 20 carbon atoms or a heterocyclic group having 5 to 12 elements formed by binding of $R_5$ and $R_6$, $R_7$ is each independently a hydrogen atom, a fluorine atom, a chlorine atom, a bromine atom, an iodine atom, a substituted or unsubstituted alkyl group having 1 to 9 carbon atoms, a substituted or unsubstituted alkoxy group having 1 to 5 carbon atoms, or a substituted or unsubstituted aryl group having 6 to 12 carbon atoms, $R_8$ is each independently a substituted or unsubstituted alkylene group having 1 to 9 carbon atoms, d is an integer of 0 to 20, and e is an integer of 1 to 500, and provided that $X_2$ is not $-C(CH_3)_2-$ when both c are 0.

[2] The curable resin composition according to the above [1], wherein the constitutional unit represented by Formula (2) contains at least one selected from the group consisting of the following Formulae (7) to (13):

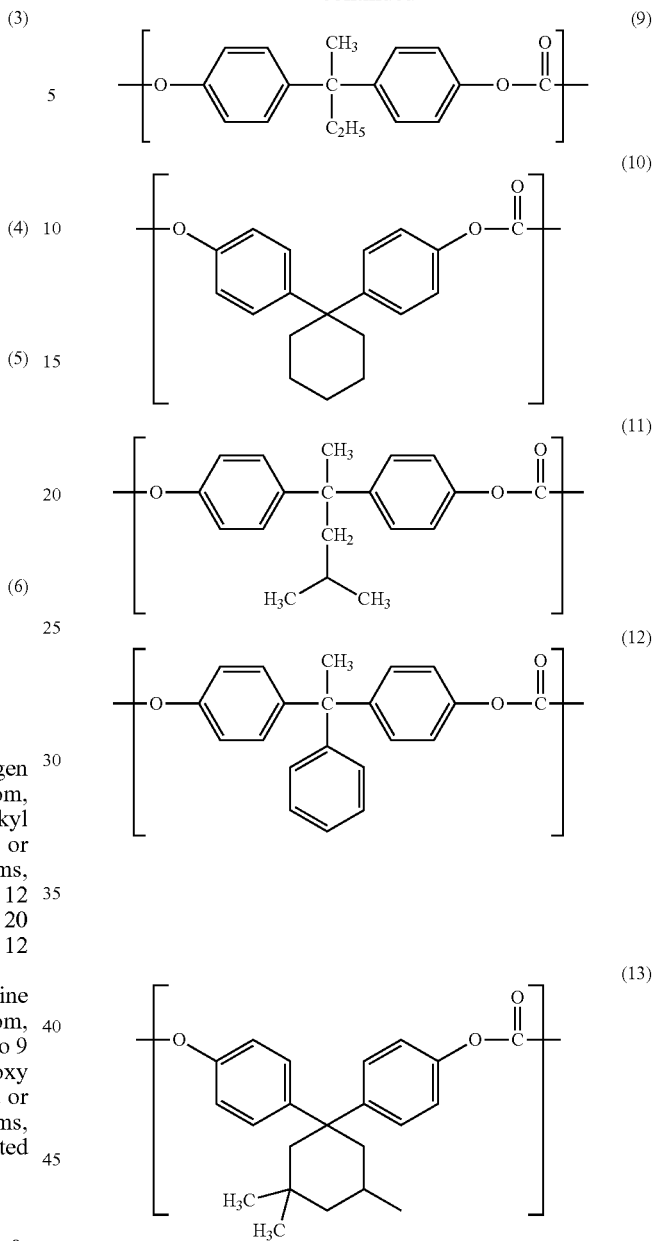

[3] The curable resin composition according to the above [1], wherein the constitutional unit represented by Formula (2) is derived from a bisphenol compound.

[4] The curable resin composition according to the above [3], wherein the bisphenol compound includes at least one selected from the group consisting of 2,2-bis(4-hydroxy-3-methylphenyl)propane, 2,2-bis(4-hydroxyphenyl)butane, 2,2-bis(4-hydroxyphenyl)-4-methylpentane, 1,1-bis(4-hydroxyphenyl)ethane, 1,1-bis(4-hydroxyphenyl)cyclohexane, 1,1-bis(4-hydroxyphenyl)-1-phenylmethane, and 1,1-bis(4-hydroxyphenyl)-3,3,5-trimethylcyclohexane.

[5] The curable composition according to any of the above [1] to [4], wherein the polycarbonate resin further contains a constitutional unit derived from bisphenol A represented by the following formula:

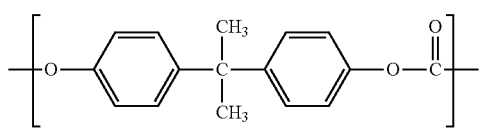

[6] The curable resin composition according to any of the above [1] to [5],
wherein, in Formula (1),
A is an isopropenyl group or a methine group,
Z is a single bond or an ester group,
$R_1$ and $R_2$ are each independently a single bond or an ethylene group, and
$R_3$ is each independently a hydrogen atom or a benzotriazole group.

[7] The curable resin composition according to the above [6], wherein the terminal structure having the unsaturated group represented by Formula (1) is derived from 2-[2-hydroxy-5-[2-(methacryloyloxy)ethyl]phenyl]-2H-benzotriazole or p-isopropenylphenol.

[8] The curable resin composition according to any of the above [1] to [7], wherein the styrenic monomer includes styrene.

[9] The curable resin composition according to any of the above [1] to [8], further containing a radical polymerization initiator.

[10] The curable resin composition according to any of the above [1] to [9], wherein the polycarbonate resin has a limiting viscosity of 0.3 to 2.0 dL/g.

[11] The curable resin composition according to any of the above [1] to [10], wherein the terminal structure having the unsaturated group represented by Formula (1) is contained in an amount of 0.2 mol % or more with respect to the constitutional unit represented by Formula (2).

[12] A molded article formed by curing the curable resin composition according to any of the above [1] to [11].

[13] The molded article according to the above [12], being a cast-molded article.

[14] A method for producing a molded article, including curing the curable resin composition according to any of the above [1] to [11].

Advantageous Effects of the Invention

According to the present invention, it is possible to provide a curable resin composition from which a molded article having excellent transparency and impact-resistance strength is obtained.

DESCRIPTION OF EMBODIMENTS

<Curable Resin Composition>

The curable resin composition according to the embodiment contains a polycarbonate resin and a styrenic monomer. In addition, a radical polymerization initiator, a solvent, an additive, and the like may be further contained.

[Polycarbonate Resin]

The polycarbonate resin has a function of improving transparency and impact-resistance strength of a molded article to be obtained from the curable resin composition. Note that, the polycarbonate resin can be present in a form graft-polymerized with the styrenic monomer, a form of a polymer obtained by reacting unsaturated groups of the polycarbonate resin, a form of the polycarbonate resin, and the like in the molded article after curing the resin composition of the present invention.

The polycarbonate resin contains a terminal structure having an unsaturated group represented by Formula (1) and a constitutional unit represented by Formula (2). The polycarbonate resin may further have another terminal structure and another constitutional unit.

Terminal Structure Having Unsaturated Group Represented by Formula (1)

The terminal structure having the unsaturated group represented by Formula (1) has a function of reacting with the styrenic monomer to form a polymer when the curable resin composition is cured, and the like.

The terminal structure having an unsaturated group is represented by the following Formula (1).

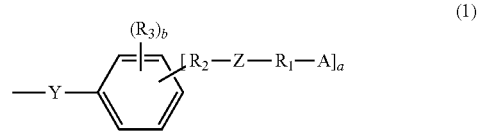

A is a vinyl group, an isopropenyl group, a styryl group, or a methine group. Among them, A is preferably a vinyl group or an isopropenyl group, and more preferably an isopropenyl group.

$R_1$ and $R_2$ are each independently selected from the group consisting of a single bond and a substituted or unsubstituted alkylene group having 1 to 20 carbon atoms.

The alkylene group having 1 to 20 carbon atoms is not particularly limited, and examples thereof include methylene, ethylene, propylene, isopropylene, butylene, isobutylene, sec-butylene, tert-butylene, and pentylene.

The substituent is not particularly limited, and examples thereof include a halogen atom (fluorine atom, chlorine atom, bromine atom, iodine atom, and the like), a cyano group, an alkoxy group having 1 to 10 carbon atoms, an alkyloxycarbonyl group having 2 to 10 carbon atoms, and an alkylcarbonyloxy group having 2 to 10 carbon atoms.

The alkoxy group having 1 to 10 carbon atoms is not particularly limited, and examples thereof include a methoxy group, an ethoxy group, a propyloxy group, an isopropyloxy group, a butoxy group, an isobutoxy group, a sec-butoxy group, a tert-butoxy group, and a pentyloxy group.

The alkyloxycarbonyl group having 2 to 10 carbon atoms is not particularly limited, and examples thereof include a methyloxycarbonyl group, an ethyloxycarbonyl group, a propyloxycarbonyl group, an isopropyloxycarbonyl group, a butyloxycarbonyl group, an isobutyloxycarbonyl group, a sec-butyloxycarbonyl group, and a tert-butyloxycarbonyl group.

The alkylcarbonyloxy group having 2 to 10 carbon atoms is not particularly limited, and examples thereof include a methylcarbonyloxy group, an ethylcarbonyloxy group, a propylcarbonyloxy group, an isopropylcarbonyloxy group, and a butylcarbonyloxy group.

Among the above, $R_1$ and $R_2$ are each independently, preferably a single bond, a substituted or unsubstituted alkylene group having 1 to 3 carbon atoms; and more preferably a single bond, methylene, or ethylene.

$R_3$ is each independently selected from the group consisting of a hydrogen atom, a substituted or unsubstituted alkyl group having 1 to 20 carbon atoms, a substituted or unsubstituted alkoxy group having 1 to 10 carbon atoms, a substituted or unsubstituted aryl group having 6 to 12 carbon atoms, and a substituted or unsubstituted heteroaryl group.

The alkyl group having 1 to 20 carbon atoms is not particularly limited, and examples thereof include a methyl group, an ethyl group, a propyl group, an isopropyl group, a butyl group, an isobutyl group, a sec-butyl group, a tert-butyl group, a pentyl group, a hexyl group, a heptyl group, an octyl group, a nonyl group, and a decyl group.

The alkoxy group having 1 to 10 carbon atoms is not particularly limited, and examples thereof include a methoxy group, an ethoxy group, a propyloxy group, an isopropyloxy group, a butoxy group, an isobutoxy group, a sec-butoxy group, a tert-butoxy group, and a pentyloxy group.

The aryl group having 6 to 12 carbon atoms is not particularly limited, and examples thereof include a phenyl group, a tolyl group, a xylyl group, a trimethylphenyl group, a tetramethylphenyl group, an ethylphenyl group, an ethylmethylphenyl group, a diethylphenyl group, a propylphenyl group, an isopropylphenyl group, an isopropylmethylphenyl group, a benzyl group, a phenethyl group, a phenylpropyl group, a naphthyl group, and a biphenyl group.

The heteroaryl group having 5 to 12 elements is not particularly limited, and examples thereof include a furanyl group, benzofuranyl group, isobenzofuranyl group, pyrrolyl group, imidazolyl group, pyrazolyl group, triazolyl group, pyridyl group, pyrazyl group, pyrimidyl group, pyridazyl group, pyrrolidyl group, indolyl group, isoindolyl group, indazolyl group, quinolyl group, isoquinolyl group, naphthyridyl group, quinoxalyl group, quinazolyl group, pteridyl group, phenanthridyl group, acridinyl group, pyrimidinyl group, phenanthrolinyl group, phenazinyl group, thiophenyl group, thiopyranyl group, benzothiophenyl group, benzothiopyranyl group, oxazolyl group, isoxazolyl group, thiazolyl group, isothiazolyl group, furazanyl group, oxadiazolyl group, dithiazolyl group, benzoxazolyl group, benzisoxazolyl group, benzothiazolyl group, benzisothiazolyl group, benzimidazolyl group, and benzotriazolyl group.

The substituent is not particularly limited, and examples thereof include a halogen atom, a cyano group, an alkoxy group having 1 to 10 carbon atoms, an alkyloxycarbonyl group having 2 to 10 carbon atoms, and an alkylcarbonyloxy group having 2 to 10 carbon atoms.

Among the above, $R_3$ is each independently, preferably a hydrogen atom, a substituted or unsubstituted aryl group having 6 to 12 carbon atoms, and a substituted or unsubstituted heteroaryl group; more preferably a hydrogen atom, a substituted or unsubstituted heteroaryl group; and still more preferably a hydrogen atom or a benzotriazolyl group.

Z is each independently selected from the group consisting of a single bond, an ether group, a carbonyl group, and an ester group. Note that, the "ester group" may be either "—OC(=O)—" or "—C(=O)O—" in this specification.

Among the above, Z is preferably a single bond or an ester group, and more preferably an ester group.

a is an integer of 1 to 3 and is preferably 1.
b is an integer of 2 to 4 and preferably 4.
Y is an ether group or an ester group, preferably an ether group or an ester group (—C(=O)O—), and more preferably an ether group.

In one embodiment, it is preferable that A is an isopropenyl group or a methine group, Z is a single bond or an ester group, $R_1$ and $R_2$ are each independently a single bond or an ethylene group, and $R_3$ is each independently a hydrogen atom or a benzotriazolyl group in Formula (1).

The terminal structure having the unsaturated group represented by Formula (1) is preferably derived from a corresponding monohydric phenol compound.

The monohydric phenol compound is not particularly limited, and examples thereof include styrenic monohydric phenol compounds such as p-hydroxystyrene and p-isopropenylphenol (IPP); allylphenol-type monohydric phenol compounds such as O-allylphenol and eugenol; (meth)acrylic monohydric phenol compounds such as 4-hydroxyphenyl(meth)acrylate, 2-[2-hydroxy-5-[2-((meth)acryloyloxy)ethyl]phenyl]-2H-benzotriazole (MBZT), 4-hydroxyphenylbutyl(meth)acrylate, and 2-phenylphenolethyl(meth)acrylate; and methine-type monohydric phenol compounds such as 4-ethynylphenol and 4-propargylphenol. These monohydric phenol compounds may be used singly or in combination of two or more thereof.

Among the above, the terminal structure having the unsaturated group represented by Formula (1) is preferably derived from a styrenic monohydric phenol compound or a (meth)acrylic monohydric phenol compound, more preferably derived from p-isopropenylphenol (IPP) or 2-[2-hydroxy-5-[2-((meth)acryloyloxy)ethyl]phenyl]-2H-benzotriazole (MBZT), and still more preferably derived from 2-[2-hydroxy-5-[2-((meth)acryloyloxy)ethyl]phenyl]-2H-benzotriazole (MBZT). Note that, in a case where the terminal structure having the unsaturated group represented by Formula (1) is derived from MBZT, a molded article after curing of the resin composition of the present invention has high impact resistance and can have an excellent appearance even in a case where the molded article is thick. Further, long-term stability is expected. Note that, "a molded article is thick" means that the thickness of the molded article is 5 mm or more in this specification.

The terminal structure having the unsaturated group represented by Formula (1) is contained in an amount of preferably 0.2 mol % or more, more preferably 0.2 to 20 mol %, still more preferably 0.5 to 10 mol %, and particularly preferably 1 to 7 mol % with respect to the constitutional unit represented by Formula (2). When the content percentage of the terminal structure having the unsaturated group represented by Formula (1) is 0.2 mol % or more, the curable resin composition reacts with the styrenic monomer to form a polymer when it is cured, and a molded article having excellent impact-resistance strength can be obtained, which is preferable.

In addition, the content of the terminal structure having the unsaturated group represented by Formula (1) is preferably 0.2 to 20 mol %, and more preferably 0.5 to 10 mol % with respect to the total number of moles of the constitutional unit and the terminal structure of the polycarbonate resin. When the content percentage of the terminal structure having the unsaturated group represented by Formula (1) is 0.2 mol % or more, the curable resin composition reacts with the styrenic monomer to form a polymer when it is cured, and a molded article having excellent impact-resistance strength can be obtained, which is preferable. On the other hand, it is preferable that the content percentage of the terminal structure having the unsaturated group represented by Formula (1) is 20 mol % or less from the viewpoint of improving the impact resistance.

Other Terminal Structures

The polycarbonate resin may have another terminal structure. The another terminal structure is a terminal structure other than the terminal structure having the unsaturated group represented by Formula (1), and is preferably a terminal structure having no unsaturated group.

Examples of the another terminal structure include those derived from other monohydric phenol compounds.

Examples of the other monohydric phenol compounds include phenol, p-tert-butylphenol, p-hexylphenol, p-heptylphenol, p-octylphenol, and p-cumylphenol. These other monohydric phenol compounds may be used singly or in combination of two or more thereof.

The another terminal structure is contained in an amount of preferably less than 50 mol %, more preferably 20 mol % or less, still more preferably 10 mol % or less, and particularly preferably 0.1 to 5 mol % with respect to the terminal structure having the unsaturated group represented by Formula (1).

In addition, the content percentage of the another terminal structure is preferably 10 mol % or less, and more preferably 0.1 to 5 mol % with respect to the total number of moles of the constitutional unit and the terminal structure of the polycarbonate resin. When the content percentage of the another terminal structure is 10 mol % or less, the content percentage of the terminal structure having the unsaturated group represented by the above (1) is relatively high, and a molded article having excellent impact-resistance strength can be obtained, which is preferable.

Constitutional Unit Represented by Formula (2)

The constitutional unit represented by Formula (2) has a function of improving the impact-resistance strength, a function of increasing the styrene solubility, and the like.

The constitutional unit is represented by the following Formula (2).

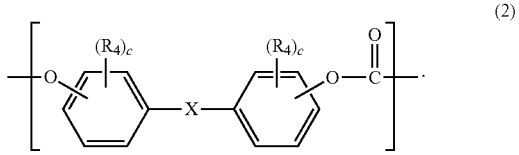

(2)

$R_4$ is each independently selected from the group consisting of a substituted or unsubstituted alkyl group having 1 to 20 carbon atoms, a substituted or unsubstituted aryl group having 6 to 12 carbon atoms, a substituted or unsubstituted alkoxy group having 1 to 5 carbon atoms, and a substituted or unsubstituted aralkyl group having 7 to 17 carbon atoms.

The alkyl group having 1 to 20 carbon atoms is not particularly limited, and examples thereof include a methyl group, an ethyl group, a propyl group, an isopropyl group, a butyl group, an isobutyl group, a sec-butyl group, a tert-butyl group, a pentyl group, a hexyl group, a heptyl group, an octyl group, a nonyl group, and a decyl group.

The aryl group having 6 to 12 carbon atoms is not particularly limited, and examples thereof include a phenyl group, a tolyl group, a xylyl group, a trimethylphenyl group, a tetramethylphenyl group, an ethylphenyl group, an ethylmethylphenyl group, a diethylphenyl group, a propylphenyl group, an isopropylphenyl group, an isopropylmethylphenyl group, a benzyl group, a phenethyl group, a phenylpropyl group, a naphthyl group, and a biphenyl group.

The alkoxy group having 1 to 5 carbon atoms is not particularly limited, and examples thereof include a methoxy group, an ethoxy group, a propyloxy group, an isopropyloxy group, a butoxy group, an isobutoxy group, a sec-butoxy group, a tert-butoxy group, and a pentyloxy group.

The aralkyl group having 7 to 17 carbon atoms is not particularly limited, and examples thereof include a benzyl group, a 1-methylbenzyl group, a 1,1-dimethylbenzyl group, a 1-ethylbenzyl group, a 1-ethyl-1-methylbenzyl group, a phenethyl group, a 1-methylphenethyl group, a 2-methylphenethyl group, and a 1-ethylphenethyl group.

The substituent is not particularly limited, and examples thereof include a halogen atom, a cyano group, an alkoxy group having 1 to 10 carbon atoms, an alkyloxycarbonyl group having 2 to 10 carbon atoms, and an alkylcarbonyloxy group having 2 to 10 carbon atoms.

Among the above, $R_4$ is preferably a substituted or unsubstituted alkyl group having 1 to 20 carbon atoms; more preferably a methyl group, an ethyl group, a propyl group, an isopropyl group, a butyl group, an isobutyl group, a sec-butyl group, or a tert-butyl group; still more preferably a methyl group or an ethyl group; and particularly preferably a methyl group.

c is each independently an integer of 0 to 4, preferably an integer of 0 to 2, and more preferably 0 or 1.

X is selected from the group consisting of —$C(R_5)(R_6)$—, —S—, —$(CH_2)_d$—, —O—, —SO—, —CO—, —$SO_2$—, and groups represented by the following Formulae (3) to (6).

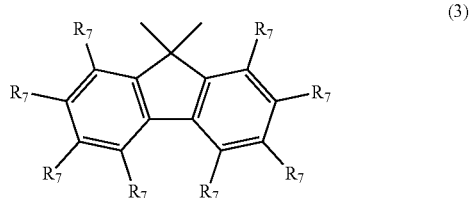

(3)

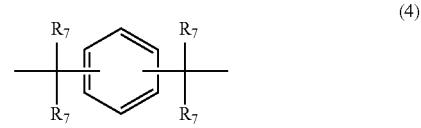

(4)

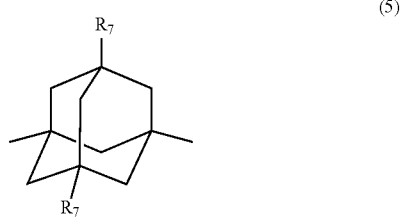

(5)

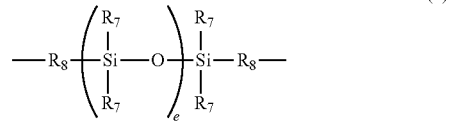

(6)

$R_5$ and $R_6$ are each independently a hydrogen atom, a fluorine atom, a chlorine atom, a bromine atom, an iodine atom, a substituted or unsubstituted alkyl group having 1 to 20 carbon atoms, a substituted or unsubstituted alkoxy group having 1 to 5 carbon atoms, a substituted or unsubstituted aryl group having 6 to 12 carbon atoms, or a carbocyclic group having 5 to 20 carbon atoms or a heterocyclic group having 5 to 12 elements formed by binding of $R_5$ and $R_6$.

The alkyl group having 1 to 20 carbon atoms is not particularly limited, and examples thereof include a methyl group, an ethyl group, a propyl group, an isopropyl group, a butyl group, an isobutyl group, a sec-butyl group, a tert-butyl group, a pentyl group, a hexyl group, a heptyl group, an octyl group, a nonyl group, and a decyl group.

The alkoxy group having 1 to 5 carbon atoms is not particularly limited, and examples thereof include a methoxy group, an ethoxy group, a propyloxy group, an isopropyloxy group, a butoxy group, an isobutoxy group, a sec-butoxy group, a tert-butoxy group, and a pentyloxy group.

The aryl group having 6 to 12 carbon atoms is not particularly limited, and examples thereof include a phenyl group, a tolyl group, a xylyl group, a trimethylphenyl group, a tetramethylphenyl group, an ethylphenyl group, an ethylmethylphenyl group, a diethylphenyl group, a propylphenyl group, an isopropylphenyl group, an isopropylmethylphenyl group, a benzyl group, a phenethyl group, a phenylpropyl group, a naphthyl group, and a biphenyl group.

The substituent is not particularly limited, and examples thereof include a halogen atom, a cyano group, an alkoxy group having 1 to 10 carbon atoms, an alkyloxycarbonyl group having 2 to 10 carbon atoms, and an alkylcarbonyloxy group having 2 to 10 carbon atoms.

The carbocyclic group having 5 to 20 carbon atoms is not particularly limited, and examples thereof include cycloalkylidene groups such as a cyclopentylidene group, a cyclohexylidene group, a cycloheptylidene group, a cyclooctylidene group, a methylcyclopentylidene group, an ethylcyclopentylidene group, a methylcyclohexylidene group, an ethylcyclohexylidene group, and a 3,3,5-trimethylcyclohexylidene group; and arylalkylidene groups such as a benzylidene group, a phenethylidene group, and a phenylpropylidene group.

The heterocyclic group having 5 to 12 elements is not particularly limited, and examples thereof include a heterocyclic group in which a methylene chain moiety is bonded to both phenylene groups of Formula (2), the methylene chain moiety being contained in pyrrolidine, 2-pyrroline, pyrazoline, pyrazolidine, imidazoline, pyran, 2-imidazoline, 1,3-dioxolane, oxolane, tetrahydrofuran, tetrahydrothiophene, piperazine, 1,4-dioxane, morpholine, 1,2-oxathiolane, 1,4-dithiane, succinimide, 2-oxazolidone, indoline, isoindoline, chroman, isochroman, quinuclidine and the like.

Among these, $R_5$ and $R_6$ are each independently, preferably a hydrogen atom, a substituted or unsubstituted alkyl group having 1 to 20 carbon atoms, a substituted or unsubstituted aryl group having 6 to 12 carbon atoms, or a carbocyclic group having 5 to 20 carbon atoms formed by binding of $R_5$ and $R_6$; more preferably a hydrogen atom, a substituted or unsubstituted alkyl group having 1 to 6 carbon atoms, a substituted or unsubstituted aryl group having 6 to 10 carbon atoms, or a carbocyclic group having 5 to 10 carbon atoms formed by binding of $R_5$ and $R_6$; still more preferably a hydrogen atom, a methyl group, an ethyl group, a propyl group, an isopropyl group, a butyl group, an isobutyl group, a sec-butyl group, a tert-butyl group, a phenyl group, or a cyclohexyl group (cyclohexane-1,1-diyl group) or 3,3,5-trimethylcyclohexyl group (3,3,5-trimethylcyclohexane-1,1-diyl group) formed by binding of $R_5$ and $R_6$.

$R_7$ is each independently a hydrogen atom, a fluorine atom, a chlorine atom, a bromine atom, an iodine atom, a substituted or unsubstituted alkyl group having 1 to 9 carbon atoms, a substituted or unsubstituted alkoxy group having 1 to 5 carbon atoms, or a substituted or unsubstituted aryl group having 6 to 12 carbon atoms.

The alkyl group having 1 to 9 carbon atoms is not particularly limited, and examples thereof include a methyl group, an ethyl group, a propyl group, an isopropyl group, a butyl group, an isobutyl group, a sec-butyl group, a tert-butyl group, a pentyl group, a hexyl group, a heptyl group, and an octyl group.

The alkoxy group having 1 to 5 carbon atoms is not particularly limited, and examples thereof include a methoxy group, an ethoxy group, a propyloxy group, an isopropyloxy group, a butoxy group, an isobutoxy group, a sec-butoxy group, a tert-butoxy group, and a pentyloxy group.

The aryl group having 6 to 12 carbon atoms is not particularly limited, and examples thereof include a phenyl group, a tolyl group, a xylyl group, a trimethylphenyl group, a tetramethylphenyl group, an ethylphenyl group, an ethylmethylphenyl group, a diethylphenyl group, a propylphenyl group, an isopropylphenyl group, an isopropylmethylphenyl group, a benzyl group, a phenethyl group, a phenylpropyl group, a naphthyl group, and a biphenyl group.

The substituent is not particularly limited, and examples thereof include a halogen atom, a cyano group, an alkoxy group having 1 to 10 carbon atoms, an alkyloxycarbonyl group having 2 to 10 carbon atoms, and an alkylcarbonyloxy group having 2 to 10 carbon atoms.

Among them, $R_7$ is each independently, preferably a hydrogen atom, a substituted or unsubstituted alkyl group having 1 to 9 carbon atoms, or a substituted or unsubstituted aryl group having 6 to 12 carbon atoms; more preferably a hydrogen atom, a methyl group, an ethyl group, or a phenyl group; and still more preferably a hydrogen atom or a methyl group.

$R_8$ is each independently a substituted or unsubstituted alkylene group having 1 to 9 carbon atoms.

Examples of the alkylene group having 1 to 9 carbon atoms include methylene, ethylene, propylene, isopropylene, butylene, isobutylene, sec-butylene, tert-butylene, and pentylene.

The substituent is not particularly limited, and examples thereof include a halogen atom, a cyano group, an alkoxy group having 1 to 10 carbon atoms, an alkyloxycarbonyl group having 2 to 10 carbon atoms, and an alkylcarbonyloxy group having 2 to 10 carbon atoms.

Among the above, $R_8$ is each independently, preferably methylene, ethylene, or propylene; and more preferably methylene or ethylene.

d is an integer of 0 to 20, preferably an integer of 0 to 10, and more preferably an integer of 0 to 3.

e is an integer of 1 to 500, preferably an integer of 1 to 100.

Provided that, in the constitutional unit represented by Formula (2), $X_2$ is not —$C(CH_3)_2$— when both c is 0. That is, the constitutional unit represented by Formula (2) does not contain a constitutional unit derived from bisphenol A (BPA, 2,2-bis(4-hydroxyphenyl)propane). Bisphenol A (BPA) mentioned above has a symmetric structure and high crystallinity, and therefore tends to have low styrene-solubility.

The constitutional unit represented by Formula (2) is preferably derived from a bisphenol compound (dihydric phenol compound). The bisphenol compound is not particularly limited, and examples thereof include bisphenol compounds in which X is —$C(R_5)(R_6)$— in Formula (2), such as bis(4-hydroxyphenyl)methane (bisphenol F: BPF), bis(2-hydroxyphenyl)methane, 2,4'-dihydroxydiphenylmethane, bis(4-hydroxy-3-methylphenyl)methane, 1,1-bis(4-hydroxyphenyl)ethane (bisphenol E: BPE), 1,1-bis(4-hydroxy-3-methylphenyl) ethane, 2,2-bis(4-hydroxy-3-methylphenyl)propane (bisphenol C: BPC), 2,2-bis(4-hydroxy-3-isopropylphenyl)propane (bisphenol G: BPG), 2,2-bis(4- hydroxyphenyl)butane (bisphenol B: BPB), 2,2-bis(4-hydroxy-3-t-butylphenyl)propane, 5,5'-(1-methylethylidene)-bis[1,1'-(bisphenyl)-2-ol]propane (bisphenol PH: BPPH), 1,1-bis(4-hydroxyphenyl)-2-methylpropane (bisphenol IBTD), 2,2-bis(4-hydroxyphenyl)-4-methylpentane (bisphenol MIBK), 1,1-bis(4-hydroxyphenyl)-2-ethylhexane (bisphenol IOTD), 1,1-bis(4-hydroxyphenyl)decane, 1,1-bis(4-hydroxyphenyl)cyclohexane (bisphenol Z: BPZ), 1,1-bis(4-hydroxyphenyl)-3,3,5-trimethylcyclohexane (bisphenol TMC), 1,1-bis(4-hydroxy-3-methylphenyl)cyclohexane, 1,1-bis(4-hydroxyphenyl)cycloundecane, 1,1-bis(4-hydroxyphenyl)cyclododecane, 1,1-bis(4-hydroxyphenyl)-1-phenylethane (bisphenol AP: BPAP), and bis(4-hydroxyphenyl)diphenylmethane (bisphenol BP; BPBP); bisphenol compounds in which X is —S— in Formula (2), such as bis(4-hydroxyphenyl)sulfide; bisphenol compounds in which X is —O— in Formula (2), such as bis(4-hydroxyphenyl)ether; bisphenol compounds in which X is —SO— in Formula (2), such as bis(4-hydroxyphenyl)sulfoxide; bisphenol compounds in which X is —CO— in Formula (2), such as bis(4-hydroxyphenyl)ketone; bisphenol compounds in which X is —SO$_2$— in Formula (2), such as bis(4-hydroxyphenyl)sulfone, 2,4'-dihydroxydiphenylsulfone, bis(2-hydroxyphenyl)sulfone, and bis(4-hydroxy-3-methylphenyl)sulfone; bisphenol compounds in which X in Formula (2) is a group represented by Formula (3), such as 9,9-bis(4-hydroxyphenyl)fluorene, 9,9-bis(4-hydroxy-3-methylphenyl)fluorene, and 9,9-bis(4-hydroxy-3-ethylphenyl)fluorene; bisphenol compounds in which X in Formula (2) is a group represented by Formula (4), such as 4,4'-[1,4-phenylenebis(1-methylethylidene)]bisphenol, and 4,4'-[1,3-phenylenebis(1-methylethylidene)]bisphenol; bisphenol compounds in which X in Formula (2) is a group represented by Formula (5), such as 1,3-bis(4-hydroxyphenyl)-5,7-dimethyladamantane; and bisphenol compounds in which X in Formula (2) is a group represented by Formula (6), such as α,ω-bis[3-(o-hydroxyphenyl)propyl]polydimethylsiloxane, and α,ω-bis[3-(o-hydroxyphenyl)propyl]polydimethyldiphenyl random copolymerized siloxane.

Among the above, the constitutional unit represented by Formula (2) preferably contains at least one of those derived from bisphenol compounds in which X is —C(R$_5$)(R$_6$)— in Formula (2); more preferably contains at least one of those derived from 2,2-bis(4-hydroxy-3-methylphenyl)propane (bisphenol C: BPC), 2,2-bis(4-hydroxyphenyl)butane (bisphenol B: BPB), 2,2-bis(4-hydroxyphenyl)-4-methylpentane (bisphenol MIBK), 1,1-bis(4-hydroxyphenyl)ethane (bisphenol E: BPE), 1,1-bis(4-hydroxyphenyl)cyclohexane (bisphenol Z: BPZ), 1,1-bis(4-hydroxyphenyl)-1-phenylethane (bisphenol AP: BPAP), and 1,1-bis(4-hydroxyphenyl)-3,3,5-trimethylcyclohexane (bisphenol TMC: TMC); still more preferably contains at least one of those derived from bisphenol C, bisphenol E, bisphenol Z, bisphenol MIBK, bisphenol AP, and bisphenol TMC; and particularly preferably contains at least one of those derived from bisphenol C, bisphenol Z, bisphenol MIBK, and bisphenol TMC. That is, in one embodiment, the bisphenol compound preferably includes at least one selected from the group consisting of 2,2-bis(4-hydroxy-3-methylphenyl)propane (bisphenol C: BPC), 2,2-bis(4-hydroxyphenyl)butane (bisphenol B: BPB), 2,2-bis(4-hydroxyphenyl)-4-methylpentane (bisphenol MIBK), 1,1-bis(4-hydroxyphenyl)ethane (bisphenolAP: BPAP), 1,1-bis(4-hydroxyphenyl)cyclohexane (bisphenol Z: BPZ), 1,1-bis(4-hydroxyphenyl)-1-phenylmethane (bisphenol AP: BPAP), and 1,1-bis(4-hydroxyphenyl)-3,3,5-trimethylcyclohexane (bisphenol TMC: TMC).

In one preferred embodiment, the constitutional unit represented by Formula (2) contains at least one selected from the group consisting of Formulae (7) to (13) below. Among them, the constitutional unit represented by Formula (2) more preferably contains at least one selected from the group consisting of Formulae (7) to (8) and Formulae (10) to (13), and still more preferably contains at least one selected from the group consisting of Formula(7), Formula (10), Formula(11), and Formula(13), from the viewpoint of excellent impact-resistance strength. In addition, in another preferred embodiment, the constitutional unit represented by Formula (2) more preferably contains at least one selected from the group consisting of Formulae (7) to (11) and (13) below, and still more preferably contains at least one selected from the group consisting of Formulae (7) and (9) below, from the viewpoint of the excellent appearance in a case where the molded article is thick. Note that, Formula (7) is derived from bisphenol C, Formula (8) is derived from bisphenol E, Formula(9) is derived from bisphenol B, Formula (10) is derived from bisphenol Z, Formula (11) is derived from bisphenol MIBK, Formula (12) is derived from bisphenol AP, and Formula (13) is derived from bisphenol TMC.

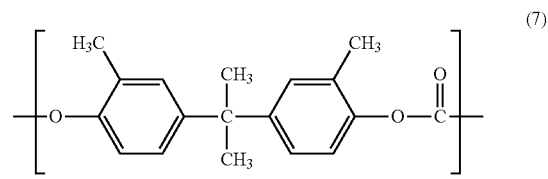

(7)

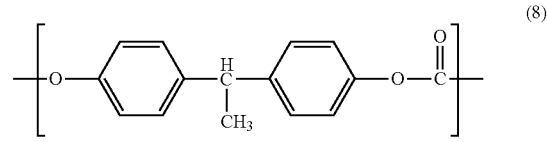

(8)

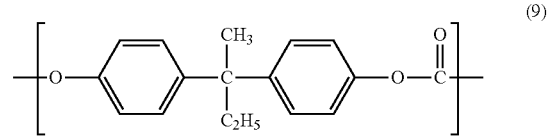

(9)

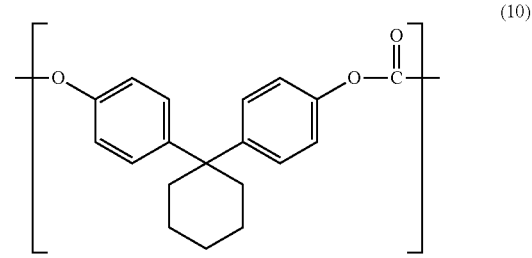

(10)

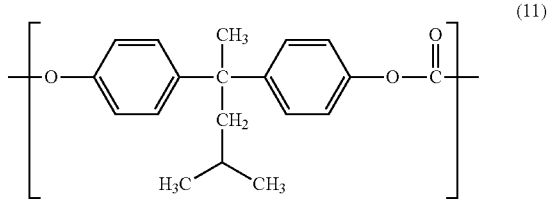

(11)

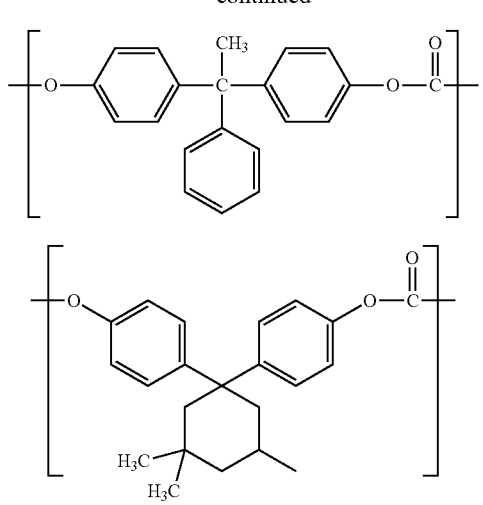

(12)

(13)

Note that, the above-mentioned bisphenol compounds may be used singly or in combination of two or more thereof.

The amount of the constitutional unit represented by Formula (2) is preferably 1 mol % or more, more preferably 2 to 100 mol %, still more preferably 5 to 100 mol %, and particularly preferably 10 to 100 mol % with respect to the total amount of constitutional units of the polycarbonate resin. When the content percentage of the constitutional unit represented by Formula (2) is 1 mol % or more, the polycarbonate resin can have increased impact-resistance strength and styrene solubility, which is preferable.

In addition, the amount of the constitutional unit represented by Formula (2) is preferably 2 to 99.8 mol %, and more preferably 5 to 99 mol % with respect to the total number of moles of the constitutional unit and the terminal structure of the polycarbonate resin. When the content percentage of the constitutional unit represented by Formula (2) is 2 mol % or more, the polycarbonate resin can have increased impact-resistance strength and styrene solubility, which is preferable. On the other hand, when the content percentage of the constitutional unit represented by Formula (2) is 99.8 mol % or less, the molecular weight is easily controlled, which is preferable.

Other Constitutional Units

The polycarbonate resin may have another constitutional unit. The another constitutional unit is a constitutional unit other than the constitutional unit represented by Formula (2).

Examples of the another constitutional unit include constitutional units derived from other bisphenol compounds and constitutional units derived from organosiloxanes.

The other bisphenol compounds are compounds other than the above-mentioned bisphenol compounds, and examples thereof include compounds from which the constitutional unit of Formula (2) is not derived. Specific examples thereof include alicyclic bisphenol compounds such as cyclohexanedimethanol, tricyclodecanedimethanol, adamantanediol, and pentacyclopentadecanedimethanol; and aromatic cyclic bisphenol compounds such as 4,4'-phenylene bisphenol and 2,2-bis(4-hydroxyphenyl)propane (bisphenol A: BPA).

In addition, examples of the organosiloxanes include polydimethylsiloxane and polydiethylsiloxane.

Among them, the polycarbonate resin preferably contains a constitutional unit derived from another bisphenol compound, more preferably contains a constitutional unit derived from an aromatic cyclic bisphenol compound, and still more preferably contains a constitutional unit derived from 2,2-bis(4-hydroxyphenyl)propane (bisphenol A: BPA).

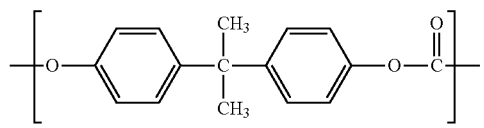

Note that, in a case where the polycarbonate resin further contains a constitutional unit derived from bisphenol A, the polycarbonate resin can have effects that raw materials have high market distributability and production cost can be decreased, a resin composition to be obtained has high viscosity and is easy for handling, the impact-resistance strength and the thickness transparency of the cured product to be obtained are improved, and the like, which is preferable. In addition, even in a case of having a constitutional unit derived from bisphenol A, the polycarbonate resin can have increased styrene solubility by having the constitutional unit represented by Formula (2).

The another constitutional unit is preferably 80 mol % or less, more preferably 70 mol % or less, and still more preferably 0 to 60 mol % with respect to the constitutional unit represented by Formula (2).

In addition, the another constitutional unit is preferably 80 mol % or less, and more preferably 0 to 60 mol % with respect to the total number of moles of the constitutional unit and the terminal structure of the polycarbonate resin. When the content percentage of the another constitutional unit is 80 mol % or less, the content percentage of the constitutional unit represented by Formula (2) is relatively high, and the styrene solubility can be increased, which is preferable.

Physical Properties and the Like of Polycarbonate Resin

In a case where the polycarbonate resin has two or more constitutional units, that is, in a case where the polycarbonate resin is a copolymer, the copolymer may be a random polymer, a block copolymer, or an alternating copolymer.

Since the polycarbonate resin has high styrene-solubility, the polycarbonate resin is dissolved in a styrenic monomer in the curable resin composition. This enables the polycarbonate resin and the styrenic monomer to be suitably graft-polymerized at the time of curing of the curable resin composition, and a molded body to be obtained can have increased impact-resistance strength. In addition, the transparency of a molded body to be obtained can also be improved. Furthermore, a molded body excellent in chemical resistance can be obtained due to high styrene-solubility of the polycarbonate resin, formation of a graft polymer, and the like. In addition, the polycarbonate resin has high styrene-solubility, which thereby enables the curable resin composition to be easily molded without containing a solvent, and a curable resin composition having a composition suitable for cast molding to be obtained. Note that, it is possible to confirm whether or not the styrene solubility is high by a method described in Examples.

The limiting viscosity of the polycarbonate resin is preferably 0.3 to 2.0 dL/g, more preferably 0.35 to 1.5 dL/g, and still more preferably 0.40 to 0.6 dL/g. When the limiting viscosity of the polycarbonate resin is 0.3 dL/g or more, the mechanical strength is increased, which is preferable. On the other hand, when the limiting viscosity of the polycarbonate resin is 2.0 dL/g or less, the moldability is increased, which is preferable.

The content of the polycarbonate resin is preferably 0.5 to 50 mass %, more preferably 1 to 50 mass %, still more preferably 1 to 30 mass %, particularly preferably 5 to 30 mass %, and most preferably 10 to 20 mass % with respect to the total mass of the curable resin composition. When the content of the polycarbonate resin is within the above range, the solubility in the styrenic monomer, the moldability, and the mechanical strength are well balanced, and the workability and the appearance of a cast-molded article are improved, which is preferable.

Method for Producing Polycarbonate Resin

The above-mentioned polycarbonate resin can be produced by a known method. Specific examples of the method for producing the polycarbonate resin include a phosgene method and a transesterification method.

The phosgene method is a method in which a monohydric phenol, a bisphenol (dihydric phenol), and phosgene are reacted in a solvent in the presence of an acid binder.

The monohydric phenol includes a monohydric phenol compound from which the terminal structure having the unsaturated group represented by Formula (1) is derived. In addition, other monohydric phenol compounds from which other terminal structures are derived may be included. Note that, the monohydric phenol functions as a polymerization degree adjusting agent.

The bisphenol (dihydric phenol) induces a bisphenol compound from which the constitutional unit represented by Formula (2) is derived. In addition, other bisphenol compounds from which other constitutional units are derived may be included.

Note that, in a case where the polycarbonate resin contains a constitutional unit derived from an organosiloxane as another constitutional unit, the organosiloxane can be used in combination.

The acid binder is not particularly limited, and examples thereof include hydroxides of alkali metals, such as sodium hydroxide and potassium hydroxide; and pyridine. These acid binders may be used singly or in combination of two or more thereof.

The solvent is not particularly limited, and examples thereof include dichloromethane and chloroform. These solvents may be used singly or in combination of two or more thereof.

In order to accelerate the above-mentioned reaction, a catalyst may be used. The catalyst is not particularly limited, and examples thereof include a tertiary amine such as triethylamine, and quaternary ammonium salts such as benzyltriethylammonium chloride. These catalysts may be used singly or in combination of two or more thereof.

Note that, in the reaction, an antioxidant such as sodium sulfite or hydrosulfite, and a branching agent such as phloroglucin or isatin bisphenol can be also added.

The reaction temperature in the phosgene method is preferably 0 to 150° C., and more preferably 5 to 40° C.

In addition, the reaction time in the phosgene method is preferably 0.5 minutes to 10 hours, and more preferably 1 minute to 2 hours.

The pH of the reaction solution is preferably 10 or more.

The transesterification method is a method in which a monohydric phenol, a bisphenol (dihydric phenol), and a bisaryl carbonate are reacted. For the above method, the organosiloxane, the antioxidant, and the branching agent mentioned above can be added in the reaction.

As the monohydric phenol, the bisphenol (dihydric phenol), the organosiloxane, the antioxidant, and the branching agent, the ones similar to those in the phosgene method are used.

Examples of the bisaryl carbonate include diphenyl carbonate, di-p-tolyl carbonate, phenyl-p-tolyl carbonate, di-p-chlorophenyl carbonate, and dinaphthyl carbonate. These bisaryl carbonates may be used singly or in combination of two or more thereof.

Note that, phenols derived from the bisaryl carbonate are preferably distilled off to the outside of the system from the viewpoint of suitably promoting the transesterification.

The reaction temperature in the transesterification method is preferably 150 to 350° C., and more preferably 200 to 300° C.

The degree of decompression in the transesterification method is preferably 1 mmHg or less.

The reaction time in the transesterification method varies depending on the reaction temperature, the degree of decompression, and the like, but is preferably 1 to 24 hours.

The reaction atmosphere in the transesterification method is preferably an inert gas atmosphere such as nitrogen or argon.

[Styrenic Monomer]

The styrenic monomer has a function of improving the impact-resistance strength, optical properties, and the like of a molded article to be obtained from the curable resin composition. Note that, the styrenic monomer can be present in a form graft-polymerized with the polycarbonate resin, a form of a polymer of the styrenic monomer (polystyrene), a form of the styrenic monomer, or the like in the molded article after curing of the resin composition of the present invention.

The styrenic monomer is not particularly limited, and examples thereof include styrene, α-methylstyrene, m-chlorostyrene, p-chlorostyrene, p-fluorostyrene, pentafluorostyrene, p-methoxystyrene, m-tert-butoxystyrene, p-tert-butoxystyrene, 4-(1-ethoxyethoxy)styrene, p-vinylbenzoic acid, p-vinylbenzaldehyde, p-chloro-α-methylstyrene, p-fluoro-α-methylstyrene, p-methyl-α-methylstyrene, p-tert-butoxy-α-methylstyrene, p-vinyltoluene, 1,1-diphenylethylene, diphenylphosphinostyrene, isopropenylphenol, p-hydroxystyrene, chloromethylstyrene, p-styrenesulfonic acid, sodium p-styrenesulfonate, 3,4-dimethoxystyrene, p-trifluoromethylstyrene, 3-acetoxy-5-hydroxystyrene, 4-cyanostyrene, m-bromostyrene, p-bromostyrene, 2,4,6-trimethylstyrene, and tert-butoxycarbonyloxystyrene. These styrenic monomers may be used singly or in combination of two or more thereof.

Among the above, the styrenic monomer preferably includes at least one of styrene, α-methylstyrene, or p-hydroxystyrene; and more preferably includes styrene.

The content of the styrenic monomer is preferably 50 to 99.5 mass %, more preferably 50 to 99.1 mass %, still more preferably 70 to 95 mass %, particularly preferably 70 to 90 mass %, and most preferably 80 to 90 mass % with respect to the total mass of the curable resin composition. When the content of the styrenic monomer is within the above range, a molded article to be obtained can have improved impact-resistance strength, optical properties, and the like, which is preferable.

[Radical Polymerization Initiator]

The curable resin composition preferably further contains a radical polymerization initiator. The radical polymerization initiator has a function of initiating a polymerization reaction by generating radicals in the unsaturated group of the terminal structure represented by Formula (1) and/or the styrenic monomer of the polycarbonate resin when a molded article is produced.

The radical polymerization initiator is not particularly limited, and examples thereof include azo compounds such as 2,2'-azobisisobutyronitrile (AIBN) and 2,2'-azobis(2,4-dimethylvaleronitrile); and peroxides such as benzoyl peroxide, hydrogen peroxide, cumene hydroperoxide, tert-butyl hydroperoxide, di-tert-butyl peroxide, potassium persulfate, sodium persulfate, and ammonium persulfate. These radical polymerization initiators may be used singly or in combination of two or more thereof.

Among the above, the radical polymerization initiator preferably includes 2,2'-azobisisobutyronitrile (AIBN), benzoyl peroxide, hydrogen peroxide, and cumene hydroperoxide; preferably includes 2,2'-azobisisobutyronitrile (AIBN) and benzoyl peroxide; and more preferably includes 2,2'-azobisisobutyronitrile (AIBN).

The content of the radical polymerization initiator is preferably 0.001 to 5 mass %, more preferably 0.005 to 3 mass %, and still more preferably 0.01 to 1 mass % with respect to the total mass of the curable resin composition. When the content of the styrenic monomer is within the above range, the polymerization reaction can suitably proceed, which is preferable.

[Solvent]

The curable resin composition may further contain a solvent. The solvent has a function of adjusting viscosity and the like.

The solvent is not particularly limited, and examples thereof include halogen-containing organic solvents such as dichloromethane, 1,2-dichloroethane, chloroform, and monochlorobenzene; ester solvents such as methyl acetate, ethyl acetate, propyl acetate, butyl acetate, 2-ethoxyethyl acetate, 2-methoxy-1-methylethyl acetate, and ethyl lactate; ketone solvents such as acetone, methyl ethyl ketone, methyl isobutyl ketone, cyclohexanone, and isophorone; carbonic acid ester solvents such as dimethyl carbonate and ethyl methyl carbonate; ether solvents such as tetrahydrofuran, 1,4-dioxane, diethyl ether, dimethoxymethane, ethyl cellosolve, and anisole; aromatic hydrocarbon solvents such as toluene, ethylbenzene, xylene, pseudocumene, and mesitylene; alcohol poor solvents such as ethanol and isopropyl alcohol; and hydrocarbon poor solvents such as n-heptane, cyclohexane, and mineral spirit. These solvents may be used singly or in combination of two or more thereof.

Among the above, the solvent preferably includes a carbonic acid ester organic solvent, a ketone organic solvent, and a toluene organic solvent; and more preferably includes ethyl acetate, methyl ethyl ketone, and toluene.

Note that, since the polycarbonate resin has high styrene-solubility, it can be suitably molded even without a solvent. Therefore, in one embodiment, it is preferable that the curable resin composition does not contain a solvent. Note that, the phrase "does not contain a solvent" means that the content of the solvent in the curable resin composition is less than 0.5 mass %, preferably less than 0.1 mass % with respect to the total mass of the curable resin composition.

[Additive]

The curable resin composition may further contain an additive.

The additive is not particularly limited, and examples thereof include other polycarbonate resins, other polymerizable components, colorants, rust inhibitors, antioxidants, dispersants, ultraviolet absorbers, antifoaming agents, and leveling agents.

Examples of the other polycarbonate resins include polycarbonate resins other than the above-mentioned polycarbonate resin.

In addition, examples of other polymerizable components include ethylene, propylene, butadiene, and acrylonitrile.

Examples of the colorants include azo pigments and phthalocyanine pigments such as Red No. 104, Red No. 106, Red No. 201, Red No. 202, Red No. 204, Red No. 215, Red No. 220, Orange No. 203, Orange No. 204, Blue No. 1, Blue No. 404, Yellow No. 205, Yellow No. 401, and Yellow No. 405; inorganic colorants such as mica titanium, titanium oxide, iron oxide, tin oxide, zirconium oxide, chromium oxide, bismuth oxychloride, silica, chromium, titanium nitride, titanium, magnesium fluoride, gold, silver, and nickel; and optical coherence particles such as glass beads, seashells, and mica.

The above-mentioned additives may be used singly or in combination of two or more thereof.

[Physical Properties of Curable Resin Composition]

The curable resin composition has a viscosity of preferably 1 to 20,000 mPa·s, more preferably 2 to 6,000 mPa·s, still more preferably 5 to 4,000 mPa·s, particularly preferably 50 to 200 mPa·s, and most preferably 90 to 180 mPa·s. When the solution viscosity of the curable resin composition is within the above range, the handling is easy, which is preferable. Note that, the solution viscosity of the curable resin composition can be measured by a method described in Examples.

<Method for Producing Curable Resin Composition>

The method for producing the curable resin composition is not particularly limited, and the curable resin composition can be produced by a known method. In one embodiment, the method for producing the curable resin composition includes a step of mixing the polycarbonate resin and the styrenic monomer. The method may further include a step of mixing at least one of the radical polymerization initiator, solvent, and additive. For example, the curable resin composition can be produced by sequentially adding the polycarbonate resin and the radical polymerization initiator to the styrenic monomer.

<Molded Article>

According to one embodiment of the present invention, there is provided a molded article obtained by curing the curable resin composition.

The molded article contains a graft polymer of the polycarbonate resin and the styrenic monomer. In addition, the molded article can contain a polymer obtained by reacting unsaturated groups of the polycarbonate resin, a polymer of the styrenic monomer (polystyrene), the polycarbonate resin, the styrenic monomer, and the like.

The polycarbonate resin has an unsaturated group and has high styrene-solubility. Therefore, the polycarbonate resin can be suitably graft-polymerized with the styrenic monomer, and a molded body excellent in impact-resistance strength can be obtained. In addition, since the polycarbonate resin has high styrene-solubility, a molded body having excellent transparency can be obtained. Furthermore, a molded body excellent in chemical resistance can be obtained due to high styrene-solubility of the polycarbonate resin, formation of a graft polymer, and the like.

The molded article is not particularly limited, and examples thereof include an injection-molded article, an extrusion-molded article, a stretch-molded article, a thermal-molded article, and a cast-molded article. Among them, a cast-molded article is preferable. Since the polycarbonate resin has high styrene-solubility, the curable resin composition has excellent moldability. For this reason, the molded article obtained by cast molding can have higher physical properties than a conventional one. In particular, in one preferred embodiment, the curable resin composition does not contain a solvent. In this case, since deformation or the like associated with volatilization of a solvent does not occur or hardly occurs, the molded article (cast-molded article) obtained by cast molding can have higher physical properties.

[Physical Properties of Molded Article]

The molded article has a total light transmittance of preferably 80 to 100%, more preferably 85 to 95%, still more preferably 87 to 94%, and particularly preferably 88 to 93%. When the total light transmittance of the molded article is within the above range, the molded article has excellent transparency, which is preferable. Note that, as the value of the "total light transmittance of the molded article", a value measured by a method described in Examples is adopted in this specification.

The molded article has an impact strength of preferably 5.0 to 100 kJ/m$^2$, more preferably 8.0 to 80 kJ/m$^2$, still more preferably 8.0 to 50 kJ/m$^2$, particularly preferably 9 to 30 kJ/m$^2$, and most preferably 10 to 20 kJ/m$^2$. When the impact strength of the molded article is within the above range, the molded article has excellent impact-resistance strength, which is preferable. Note that, as the value of "the impact strength of the molded article", a value measured by a method described in Examples is adopted in this specification.

The molded article can have chemical resistance. Accordingly, the molded article can be suitably applied to applications in which molded article chemical resistance is required. Note that, it is possible to confirm whether or not a molded article has chemical resistance by a method described in Examples.

The molded article mentioned above can be suitably applied to various applications, specifically, applications such as a lens, a cover member of a touch panel, a housing of a device, resin glass, a substitute for automobile glass, a water tank, a light guide plate, a hard coat, a paint, a photoresist, and a 3D printer.

<Method for Producing Molded Article>

According to one embodiment of the present invention, there is provided a method for producing the molded article, the method including curing the above-mentioned curable resin composition.

The curing usually includes graft polymerization of the polycarbonate resin and the styrenic monomer contained in the curable resin composition. In addition, polymerization of the polycarbonate resin and polymerization of the styrenic monomer can be included.

Note that, the curing (polymerization) is preferably bulk polymerization. Since the polycarbonate resin has high styrene-solubility, bulk polymerization can be suitably performed using a curable resin composition containing no solvent.

In another embodiment, the curing (polymerization) may be also performed by suspension polymerization. Examples of the suspension polymerization method include a method in which the curable resin composition is fed into water to be polymerized. For this polymerization, a solvent may be used in combination with the water.

The curing method is not particularly limited, and examples thereof include thermal curing and photocuring.

The curing temperature (polymerization temperature) for performing thermal curing is preferably equal to or lower than the boiling point of the styrenic monomer, and is preferably 40 to 100° C., more preferably 50 to 90° C., and particularly preferably 60 to 80° C.

The curing time (polymerization time) for performing thermal curing is not particularly limited, and is preferably 5 minutes to 48 hours, more preferably 10 minutes to 30 hours, and still more preferably 30 minutes to 24 hours.

The irradiation light used for performing photocuring is preferably visible light to ultraviolet light, more preferably irradiation light having a wavelength of 190 to 450 nm, still more preferably irradiation light having a wavelength of 200 to 400 nm, and still more preferably irradiation light having a wavelength of 250 to 380 nm.

The irradiation time for performing photocuring is preferably 1 second to 2 hours, more preferably 3 seconds to 1 hour, and still more preferably 5 seconds to 30 minutes.

The integrated quantity of light for performing photocuring is preferably 50 m to 100 J/cm$^2$, more preferably 100 m to 50 J/cm$^2$, and still more preferably 300 m to 20 J/cm$^2$.

Examples of a method for molding the molded article include injection molding, extrusion molding, stretch molding, thermal molding, and cast molding. Among them, the molding method is preferably cast molding. As mentioned above, the polycarbonate resin has high styrene-solubility, so that a curable resin composition containing no solvent can be used to suitably produce a cast-molded article. During the above production, time degradation or the like due to volatilization of a solvent does not occur or hardly occurs in the cast-molded article.

In one preferred embodiment, the method for producing the molded article includes steps of injecting the above-mentioned curable resin composition into a mold, curing the curable resin composition injected into the mold, and removing the obtained cured product from the mold.

Note that, examples of the mold include a metal mold and a mold made of silicone.

Examples of a method for injection into the mold (casting method) include gravity casting methods such as a top-gate system and an under-gate system, a vacuum casting method, and a centrifugal method. These casting methods may be used singly or in combination of two or more thereof.

EXAMPLES

Examples of the present invention will be shown below, but the present invention is not limited to the aspects of the examples.

<Styrene Solubility of Polycarbonate Resin>

A poly carbonate resin and styrene were mixed so that the concentration of the polycarbonate resin was 5 to 30 mass %. The obtained solution was shaken on a shaker for 24 hours and evaluated visually according to the following criteria.

○: No undissolved residue of the polycarbonate resin exists.

x: An undissolved residue of the polycarbonate resin exists.

<Method for Measuring Limiting Viscosity of Polycarbonate Resin>

A polycarbonate resin was dissolved in dichloromethane to prepare a solution (0.5 mass/volume %). The limiting viscosity of the obtained solution was measured using an Ubbelohde viscosity tube under the conditions of 20° C. and a Huggins constant of 0.45.

<Method for Measuring Viscosity of Curable Resin Composition>

The viscosity of a curable resin composition was measured under the condition of 25° C. using a vibration-type viscometer CJV 5000 (manufactured by A & D Company, Limited).

<Method for Measuring Total Light Transmittance of Molded Article>

A measurement sample was prepared by cast molding. Specifically, 1.3 g of a curable resin composition was put in a cylindrical glass mold having an inner diameter of 53 mm, which was then hermetically sealed, and the cylindrical glass mold in which the curable resin composition was enclosed was immersed in a hot water bath at 70° C. for 24 hours to be heated. The curable resin composition was thereby cured to obtain a measurement sample (cast-molded article) having a diameter of 53 mm×a thickness of 0.5 mm.

The total light transmittance of the measurement sample was measured using a haze meter NDH 4000 (manufactured by Nippon Denshoku Industries Co., Ltd.).

<Measurement of Impact Strength of Molded Article>

A measurement sample was prepared by cast molding. Specifically, 1.3 g of a curable resin composition was put in a cylindrical glass tube having an inner diameter of 4.4 mm and a height of 30 mm, which was then hermetically sealed, and the cylindrical glass tube in which the curable resin composition was enclosed was immersed in a hot water bath at 70° C. for 24 hours to be heated. The curable resin composition was thereby cured to obtain a measurement sample (cylindrical cast-molded article) having an inner diameter of about 4.4 mm×a height of about 30 mm.

The impact strength was measured by using an impact tester IT (manufactured by Toyo Seiki Seisaku-sho, Ltd.) and fixing the measurement sample to a self-made jig, under the conditions of an Izod 2J weight and shaking down at 150 degrees.

<Chemical Resistance Test of Molded Article>

A chemical resistance test was performed using a measurement sample (cylindrical cast-molded article) prepared in the measurement of the impact strength.

The measurement sample and 50 mL of dichloromethane were put in a cylindrical glass container having a diameter of 40 mm, which was then hermetically sealed and allowed to stand. After 24 hours, the measurement sample was visually observed and evaluated according to the following criteria.

○: An undissolved molded article can be seen.

x: No undissolved molded article can be seen.

<Appearance Test of Thick Molded Article>

The curable resin composition (10 g) was put into a cylindrical glass container having a diameter of 40 mm (inner diameter: 38 mm), which was then hermetically sealed, immersed in a hot water bath at 70° C. for 24 hours to be heated, then opened, and hot-air dried at 100° C. for 24 hours. The molded article had a thickness of 9 to 10 mm and thereby had residual bubbles and surface roughness, and thus, the transmittance could not be measured. Therefore, the transparency was evaluated by 5 levels by visually determining the appearance.

5: Visually transparent without cloudiness or white turbidity.

4: Highly transparent although slight cloudiness or slight white turbidity is observed.

3: Transparent although cloudiness or white turbidity is observed

2: Low transparent with strong cloudiness or white turbidity.

1: Opaque with extremely strong cloudiness and white turbidity.

Example 1

(Preparation of Polycarbonate Resin)

In 1100 mL (5 mass/mass %) of an aqueous sodium hydroxide solution, 61.3 g (0.24 mol) of bisphenol C (BPC: 2,2-bis(4-hydroxy-3-methylphenyl)propane, manufactured by Honshu Chemical Industry Co., Ltd.), 41.2 g (0.18 mol) of bisphenol A (BPA: 2,2-bis(4-hydroxyphenyl)propane, manufactured by Mitsubishi Chemical Corporation), 0.2 g of hydrosulfite, and 0.08 g of benzyltriethylammonium chloride (TEBAC, manufactured by Tokyo Chemical Industry Co., Ltd.) as a quaternary ammonium salt were dissolved.

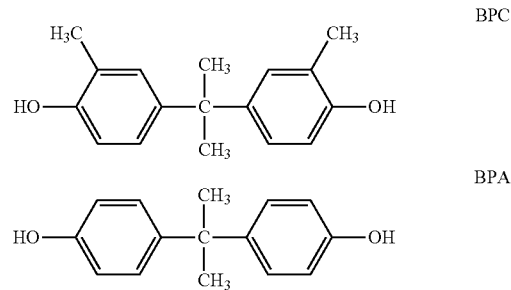

To the obtained solution, 400 mL of dichloromethane was added, which was then stirred and cooled to 15 to 20° C. Then, 60 g of phosgene was blown into the solution over a period of about 60 minutes.

After completion of the phosgene blowing, 4.05 g (0.0133 mol) of 2-[2-hydroxy-5-[2-(methacryloyloxy)ethyl]phenyl]-2H-benzotriazole (MBZT, manufactured by Otsuka Chemical Co., Ltd.) and 100 mL (10 mass/mass %) of an aqueous sodium hydroxide solution were added to the reaction solution, which was then vigorously stirred to be emulsified. After the emulsification, 0.5 mL of triethylamine was added, which was then stirred at 20 to 30° C. for about 40 minutes to perform a polymerization reaction.

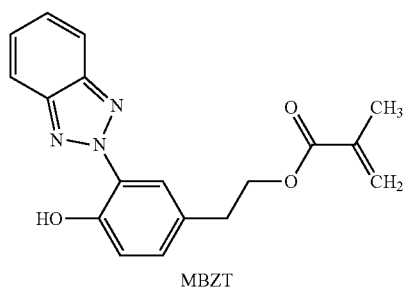 [SMILES: C=C(C)C(=O)OCCc1ccc(O)c(-n2nc3ccccc3n2)c1]

After completion of the polymerization reaction, the reaction liquid was separated into an aqueous phase and an organic phase. The organic phase was neutralized with phosphoric acid and then washed with water repeatedly until the conductivity of the washing liquid (aqueous phase) reached 10 μS/cm or less. The obtained solution was added dropwise to warm water at 60° C., and the solvent was removed by evaporation to obtain a white powdery precipitate. The obtained precipitate was filtered and dried at 110° C. for 24 hours to obtain a powdery polycarbonate resin.

The styrene solubility and limiting viscosity of the obtained polycarbonate resin were measured. The obtained results are shown in Table 1 below.

Note that, the result of analysis by an infrared absorption spectrum showed absorption by a carbonyl group at a position of about 1770 cm$^{-1}$ and absorption by an ether bond at a position of about 1240 cm$^{-1}$, and it was confirmed that the resin was a polycarbonate resin, which has a carbonate bond.

(Production of Curable Composition)

From a styrene monomer (manufactured by FUJIFILM Wako Pure Chemical Corporation), the polymerization inhibitor was removed using an aqueous sodium hydroxide solution (5% by mass), and a styrene monomer (ST) dehydrated with anhydrous sodium sulfate was obtained. The polycarbonate resin (3 parts by mass) prepared above was dissolved in 17 parts by mass of the styrene monomer. Subsequently, 0.01 parts by mass of azobisisobutyronitrile (AIBN) was added as a radical polymerization initiator to produce a curable resin composition.

The viscosity of the curable resin composition produced was measured. In addition, a molded article was produced from the curable resin composition produced, and the total light transmittance, impact strength, chemical resistance, and appearance of a thick molded article were evaluated. The obtained results are shown in Table 1 below.

Example 2

A polycarbonate resin and a curable resin composition were produced in a similar method to Example 1 except that 90 g of bisphenol Z (BPZ: 1,1-bis(4-hydroxyphenyl)cyclohexane) was used in place of BPC and BPA, the amount of MBZT was changed to 3.60 g, the amount of phosgene was changed to 47 g, and no TEBAC was used.

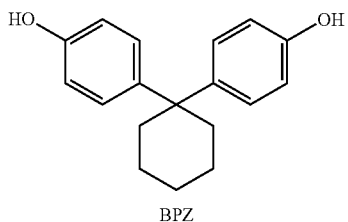 [SMILES: Oc1ccc(C2(c3ccc(O)cc3)CCCCC2)cc1]

BPZ

Note that, the styrene solubility and limiting viscosity of the polycarbonate resin, the viscosity of the curable resin composition, and the total light transmittance, impact strength, chemical resistance, and thick molded article appearance of the molded article obtained by casting the curable resin composition were evaluated in a similar method to Example 1. The obtained results are shown in Table 1 below.

Example 3

A polycarbonate resin and a curable resin composition were produced in a similar method to Example 1 except that 80 g of bisphenol B (BPB: 2,2-bis(4-hydroxyphenyl)butane, manufactured by Honshu Chemical Industry Co., Ltd.) was used in place of BPC and BPA, the amount of MBZT was changed to 3.55 g, the amount of phosgene was changed to 47 g, and no TEBAC was used.

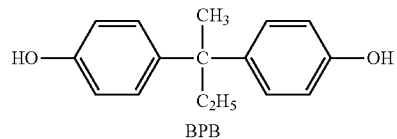

BPB

Note that, the styrene solubility and limiting viscosity of the polycarbonate resin, the viscosity of the curable resin composition, and the total light transmittance, impact strength, chemical resistance, and thick molded article appearance of the molded article obtained by casting the curable resin composition were evaluated in a similar method to Example 1. The obtained results are shown in Table 1 below.

Example 4

A polycarbonate resin and a curable resin composition were produced in a similar method to Example 1 except that 80 g of bisphenol E (BPE: 1,1-bis(4-hydroxyphenyl)ethane, manufactured by Honshu Chemical Industry Co., Ltd.) was used in place of BPC and BPA, the amount of MBZT was changed to 4.05 g, the of amount of phosgene was changed to 52 g, and no TEBAC was used.

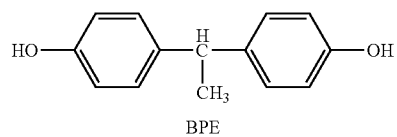

BPE

Note that, the styrene solubility and limiting viscosity of the polycarbonate resin, the viscosity of the curable resin composition, and the total light transmittance, impact strength, chemical resistance, and thick molded article appearance of the molded article obtained by casting the curable resin composition were evaluated in a similar method to Example 1. The obtained results are shown in Table 1 below.

Example 5

A polycarbonate resin and a curable resin composition were produced in a similar method to Example 1 except that 80 g of MIBK (2,2-bis(4-hydroxyphenyl)-4-methylpentane, manufactured by Honshu Chemical Industry Co., Ltd.) was used in place of BPC and BPA, the amount of MBZT was changed to 3.58 g, the amount of phosgene was changed to 49 g, and no TEBAC was used.

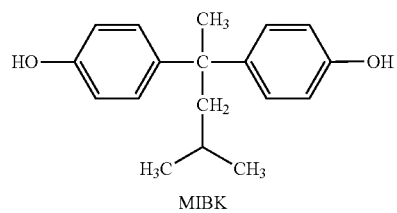

MIBK

Note that, the styrene solubility and limiting viscosity of the polycarbonate resin, the viscosity of the curable resin composition, and the total light transmittance, impact strength, chemical resistance, and thick molded article appearance of the molded article obtained by casting the curable resin composition were evaluated in a similar method to Example 1. The obtained results are shown in Table 1 below.

Example 6

A polycarbonate resin and a curable resin composition were produced in a similar method to Example 1 except that the amount of the polycarbonate resin used was changed to 1 part by mass and the amount of the styrene monomer used was changed to 19 parts by mass.

Note that, the styrene solubility and limiting viscosity of the polycarbonate resin, the viscosity of the curable resin composition, and the total light transmittance, impact strength, chemical resistance, and thick molded article appearance of the molded article obtained by casting the curable resin composition were evaluated in a similar method to Example 1. The obtained results are shown in Table 1 below.

Example 7

A polycarbonate resin and a curable resin composition were produced in a similar method to Example 1 except that the amount of the polycarbonate resin used was changed to 6 parts by mass and the amount of the styrene monomer used was changed to 14 parts by mass.

Note that, the styrene solubility and limiting viscosity of the polycarbonate resin, the viscosity of the curable resin composition, and the total light transmittance, impact strength, chemical resistance, and thick molded article appearance of the molded article obtained by casting the curable resin composition were evaluated in a similar method to Example 1. The obtained results are shown in Table 1 below.

Example 8

A polycarbonate resin and a curable resin composition were produced in a similar method to Example 1 except that 1.68 g of p-isopropenylphenol (IPP, manufactured by Mitsui Fine Chemicals, Inc.) was used in place of MBZT.

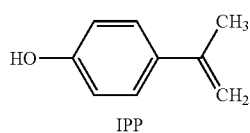

IPP

Note that, the styrene solubility and limiting viscosity of the polycarbonate resin, the viscosity of the curable resin composition, and the total light transmittance, impact strength, chemical resistance, and thick molded article appearance of the molded article obtained by casting the curable resin composition were evaluated in a similar method to Example 1. The obtained results are shown in Table 1 below.

Example 9

A polycarbonate resin and a curable resin composition were produced in a similar method to Example 1 except that 116 g of bisphenol AP (BPAP: 1,1-bis(4-hydroxyphenyl)-1-phenylmethane, manufactured by Honshu Chemical Industry Co., Ltd.) was used in place of BPC and BPA, the amount of MBZT was changed to 3.58 g, the amount of phosgene was changed to 49 g, and no TEBAC was used.

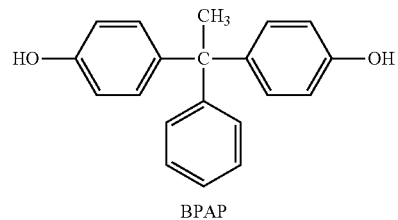 [SMILES: CC(c1ccccc1)(c1ccc(O)cc1)c1ccc(O)cc1]

BPAP

Note that, the styrene solubility and limiting viscosity of the polycarbonate resin, the viscosity of the curable resin composition, and the total light transmittance, impact strength, chemical resistance, and thick molded article appearance of the molded article obtained by casting the curable resin composition were evaluated in a similar method to Example 1. The obtained results are shown in Table 1 below.

Example 10

A polycarbonate resin and a curable resin composition were produced in a similar method to Example 1 except that 102.4 g of only BPC was used in place of BPC and BPA, the amount of MBZT was changed to 4.10 g, the amount of phosgene was changed to 58 g.

Note that, the styrene solubility and limiting viscosity of the polycarbonate resin, the viscosity of the curable resin composition, and the total light transmittance, impact strength, chemical resistance, and thick molded article appearance of the molded article obtained by casting the curable resin composition were evaluated in a similar method to Example 1. The obtained results are shown in Table 1 below.

Example 11

A poly carbonate resin and a curable resin composition were produced in a similar method to Example 1 except that 108.5 g of bisphenol TMC (TMC: 1,1-bis(4-hydroxyphenyl)-3,3,5-trimethylcyclohexane, manufactured by Songwon Industrial Co., Ltd.) was used in place of BPC and BPA, the amount of MBZT was changed to 3.10 g, the amount of phosgene was changed to 50 g, and no TEBAC was used.

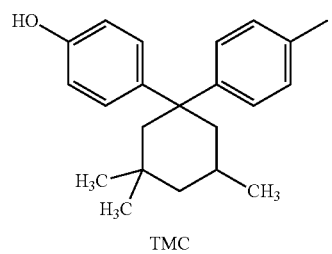 [SMILES: Cc1ccc(C2(c3ccc(O)cc3)CC(C)CC(C)(C)C2)cc1]

TMC

Note that, the styrene solubility and limiting viscosity of the polycarbonate resin, the viscosity of the curable resin composition, and the total light transmittance, impact strength, chemical resistance, and thick molded article appearance of the molded article obtained by casting the curable resin composition were evaluated in a similar method to Example 1. The obtained results are shown in Table 1 below.

Comparative Example 1

A polycarbonate resin and a curable resin composition were produced in a similar method to Example 1 except that 2.63 g of p-tert-butylphenol (PTBP, manufactured by DIC Corporation) was used in place of MBZT.

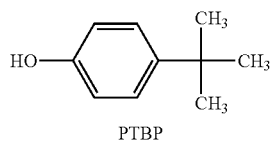

PTBP

Note that, the styrene solubility and limiting viscosity of the polycarbonate resin, the viscosity of the curable resin composition, and the total light transmittance, impact strength, chemical resistance, and thick molded article appearance of the molded article obtained by casting the curable resin composition were evaluated in a similar method to Example 1. The obtained results are shown in Table 1 below.

Comparative Example 2

A polycarbonate resin and a curable resin composition were produced in a similar method to Example 2 except that 1.44 g of PTBP was used in place of MBZT.

Note that, the styrene solubility and limiting viscosity of the polycarbonate resin, the viscosity of the curable resin composition, and the total light transmittance, impact strength, chemical resistance, and thick molded article appearance of the molded article obtained by casting the curable resin composition were evaluated in a similar method to Example 1. The obtained results are shown in Table 1 below.

Comparative Example 3

A polycarbonate resin and a curable resin composition were produced in a similar method to Example 3 except that 1.65 g of PTBP was used in place of MBZT.

Note that, the styrene solubility and limiting viscosity of the polycarbonate resin, the viscosity of the curable resin composition, and the total light transmittance, impact strength, chemical resistance, and thick molded article appearance of the molded article obtained by casting the curable resin composition were evaluated in a similar method to Example 1. The obtained results are shown in Table 1 below.

Comparative Example 4

A polycarbonate resin and a curable resin composition were produced in a similar method to Example 4 except that 2.34 g of PTBP was used in place of MBZT.

Note that, the styrene solubility and limiting viscosity of the polycarbonate resin, the viscosity of the curable resin composition, and the total light transmittance, impact strength, chemical resistance, and thick molded article appearance of the molded article obtained by casting the curable resin composition were evaluated in a similar method to Example 1. The obtained results are shown in Table 1 below.

Comparative Example 5

A polycarbonate resin and a curable resin composition were produced in a similar method to Example 5 except that 1.67 g of PTBP was used in place of MBZT.

Note that, the styrene solubility and limiting viscosity of the polycarbonate resin, the viscosity of the curable resin composition, and the total light transmittance, impact strength, chemical resistance, and thick molded article appearance of the molded article obtained by casting the curable resin composition were evaluated in a similar method to Example 1. The obtained results are shown in Table 1 below.

Comparative Example 6

A polycarbonate resin and a curable resin composition were produced in a similar method to Example 1 except that 91.2 g of only BPA was used in place of BPC and BPA, 2.00 g of PTBP was used in place of MBZT, the amount of phosgene was changed to 55 g, and no TEBAC was used.

Note that, the styrene solubility and limiting viscosity of the polycarbonate resin, the viscosity of the curable resin composition, and the total light transmittance, impact strength, chemical resistance, and thick molded article appearance of the molded article obtained by casting the curable resin composition were evaluated in a similar method to Example 1. The obtained results are shown in Table 1 below.

Comparative Example 7

A polycarbonate resin and a curable resin composition were produced in a similar method to Example 1 except that 91.2 g of only BPA was used in place of BPC and BPA, the amount of MBZT was changed to 4.97 g, and no TEBAC was used.

Note that, the styrene solubility and limiting viscosity of the polycarbonate resin, the viscosity of the curable resin composition, and the total light transmittance, impact strength, chemical resistance, and thick molded article appearance of the molded article obtained by casting the curable resin composition were evaluated in a similar method to Example 1. The obtained results are shown in Table 1 below.

Comparative Example 8

A polycarbonate resin and a curable resin composition were produced in a similar method to Example 1 except that no polycarbonate resin was used.

Note that, the styrene solubility and limiting viscosity of the polycarbonate resin, the viscosity of the curable resin composition, and the total light transmittance, impact strength, chemical resistance, and thick molded article appearance of the molded article obtained by casting the curable resin composition were evaluated in a similar method to Example 1. The obtained results are shown in Table 1 below.

Comparative Example 9

A polycarbonate resin and a curable resin composition were produced in a similar method to Example 1 except that 102.4 g of only BPC was used in place of BPC and BPA, 1.42 g of PTBP was used in place of MBZT, the amount of phosgene was changed to 58 g, and no TEBAC was used.

Note that, the styrene solubility and limiting viscosity of the polycarbonate resin, the viscosity of the curable resin composition, and the total light transmittance, impact strength, chemical resistance, and thick molded article appearance of the molded article obtained by casting the curable resin composition were evaluated in a similar method to Example 1. The obtained results are shown in Table 1 below.

Comparative Example 10

A polycarbonate resin and a curable resin composition were produced in a similar method to Example 1 except that 108.5 g of TMC was used in place of BPC and BPA, 1.42 g of PTBP was used in place of MBZT, the amount of phosgene was changed to 50 g, and no TEBAC was used.

Note that, the styrene solubility and limiting viscosity of the polycarbonate resin, the viscosity of the curable resin composition, and the total light transmittance, impact strength, chemical resistance, and thick molded article appearance of the molded article obtained by casting the curable resin composition were evaluated in a similar method to Example 1. The obtained results are shown in Table 1 below.

The results in Table 1 show that the molded articles produced from the curable resin compositions of Examples 1 to 11 have high total light transmittance and excellent transparency, and also have high impact-resistance strength. It is also found that the molded articles are excellent in chemical resistance.

On the other hand, it is found that the molded articles produced from the curable resin compositions of Comparative Examples 1 to 6 and 9 to 10 have low impact-resistance strength. The reason for this is considered to be that the styrene monomer could not form a covalent bond with the polycarbonate resin during curing because the polycarbonate resin does not have an unsaturated group in the terminal structure.

It is also found that, in the molded articles produced from the curable resin compositions of Comparative Examples 6 and 7, both total light transmittance and impact-resistance strength are low. The reason for this is considered to be that the styrene solubility was low since the constitutional unit of the polycarbonate resins was only BPA. Particularly in Comparative Example 7, it is considered that the polycarbonate resin had an unsaturated group in the terminal structure but had low styrene solubility, and therefore, the reaction between the terminal unsaturated group of the polycarbonate resin and the styrene monomer did not suitably proceed during curing.

TABLE 1

| | Constitution | | | | Evaluation result | | | | | | |
|---|---|---|---|---|---|---|---|---|---|---|---|
| | Polycarbonate resin | | | Curable resin | Polycarbonate resin | | Resin | Molded article | | | |
| | | | | | | | | Total | | | Thick |
| | Main backbone monomer | Copolymerized monomer | Terminal monomer | composition PC amount (mass %) | Styrene solubility | Limiting viscosity (dL/g) | composition Viscosity (mPa · s) | light transmittance (%) | Impact strength (kJ/m$^2$) | Chemical resistance | molded article appearance |
| Example 1 | BPC | BPA | MBZT | 15 | ○ | 0.57 | 125 | 89.2 | 10.1 | ○ | 5 |
| Example 2 | BPZ | — | MBZT | 15 | ○ | 0.46 | 97 | 88.3 | 11.7 | ○ | 4 |
| Example 3 | BPB | — | MBZT | 15 | ○ | 0.52 | 121 | 89.9 | 8.3 | ○ | 5 |
| Example 4 | BPE | — | MBZT | 15 | ○ | 0.59 | 168 | 88.4 | 9.6 | ○ | 4 |
| Example 5 | MIBK | — | MBZT | 15 | ○ | 0.51 | 110 | 88.0 | 12.2 | ○ | 4 |
| Example 6 | BPC | BPA | MBZT | 5 | ○ | 0.57 | 5.7 | 88.2 | 5.4 | ○ | 5 |
| Example 7 | BPC | BPA | MBZT | 30 | ○ | 0.57 | 3916 | 88.8 | 14.5 | ○ | 5 |
| Example 8 | BPC | BPA | IPP | 15 | ○ | 0.57 | 108 | 89.0 | 9.7 | ○ | 3 |
| Example 9 | BPAP | — | MBZT | 15 | ○ | 0.48 | 107 | 87.7 | 9.3 | ○ | 3 |
| Example 10 | BPC | — | MBZT | 15 | ○ | 0.54 | 78 | 89.0 | 11.8 | ○ | 5 |
| Example 11 | TMC | — | MBZT | 15 | ○ | 0.47 | 101 | 88.1 | 12.1 | ○ | 4 |
| Comparative Example 1 | BPC | BPA | PTBP | 15 | ○ | 0.54 | 96 | 85.2 | 3.6 | x | 2 |
| Comparative Example 2 | BPZ | — | PTBP | 15 | ○ | 0.44 | 94 | 85.9 | 2.4 | x | 2 |
| Comparative Example 3 | BPB | — | PTBP | 15 | ○ | 0.50 | 112 | 87.2 | 3.7 | x | 2 |
| Comparative Example 4 | BPE | — | PTBP | 15 | ○ | 0.44 | 87 | 85.4 | 3.5 | x | 2 |
| Comparative Example 5 | MIBK | — | PTBP | 15 | ○ | 0.49 | 80 | 83.8 | 4.3 | x | 1 |
| Comparative Example 6 | BPA | — | PTBP | 15 | x | 0.50 | 1.0 | 42.9 | 2.3 | x | 1 |
| Comparative Example 7 | BPA | — | MBZT | 15 | x | 0.50 | 1.0 | 54.6 | 2.7 | x | 1 |
| Comparative Example 8 | — | — | — | 0 | — | — | 0.8 | 90.7 | 3.1 | x | 5 |
| Comparative Example 9 | BPC | — | PTBP | 15 | ○ | 0.63 | 126 | 84.4 | 3.8 | x | 2 |
| Comparative Example 10 | TMC | — | PTBP | 15 | ○ | 0.48 | 103 | 82.5 | 2.7 | x | 2 |

The invention claimed is:

1. A curable resin composition comprising a polycarbonate resin and a styrenic monomer, the polycarbonate resin comprising:
a terminal structure that is derived from a (meth)acrylic monohydric phenol compound and is represented by Formula (1):

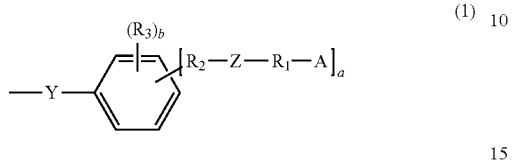

wherein A is a vinyl group or an isopropenyl group,
$R_1$ is a single bond and $R_2$ is selected from the group consisting of a single bond and a substituted or unsubstituted alkylene group having 1 to 20 carbon atoms,
$R_3$ is each independently selected from the group consisting of a hydrogen atom, a substituted or unsubstituted alkyl group having 1 to 20 carbon atoms, a substituted or unsubstituted alkoxy group having 1 to 10 carbon atoms, a substituted or unsubstituted aryl group having 6 to 12 carbon atoms, and a substituted or unsubstituted heteroaryl group having 5 to 12 elements,
Z is —OC(=O)—,
a is an integer of 1 to 3,
b is an integer of 2 to 4, and
Y is an ether group or an ester group; and
a constitutional unit represented by Formula (2):

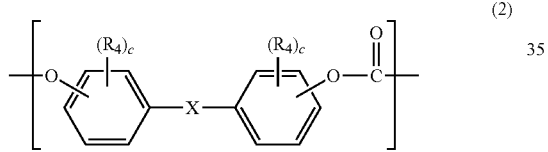

wherein $R_4$ is each independently selected from the group consisting of a substituted or unsubstituted alkyl group having 1 to 20 carbon atoms, a substituted or unsubstituted aryl group having 6 to 12 carbon atoms, a substituted or unsubstituted alkoxy group having 1 to 5 carbon atoms, and a substituted or unsubstituted aralkyl group having 7 to 17 carbon atoms,
c is each independently an integer of 0 to 4,
X is selected from the group consisting of —C($R_5$)($R_6$)—, —S—, —(CH$_2$)$_d$—, —O—, —SO—, —CO—, —SO$_2$—, and groups represented by Formulae (3) to (6):

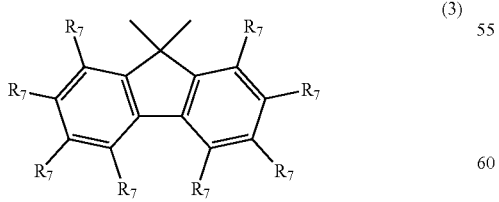

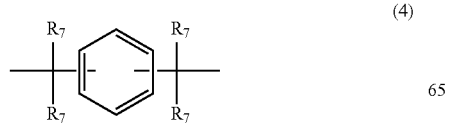

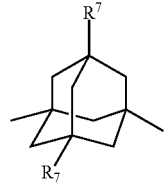

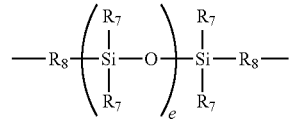

wherein $R_5$ and $R_6$ are each independently a hydrogen atom, a fluorine atom, a chlorine atom, a bromine atom, an iodine atom, a substituted or unsubstituted alkyl group having 1 to 20 carbon atoms, a substituted or unsubstituted alkoxy group having 1 to 5 carbon atoms, a substituted or unsubstituted aryl group having 6 to 12 carbon atoms, or a carbocyclic group having 5 to 20 carbon atoms or a heterocyclic group having 5 to 12 elements formed by binding of $R_5$ and $R_6$,
$R_7$ is each independently a hydrogen atom, a fluorine atom, a chlorine atom, a bromine atom, an iodine atom, a substituted or unsubstituted alkyl group having 1 to 9 carbon atoms, a substituted or unsubstituted alkoxy group having 1 to 5 carbon atoms, or a substituted or unsubstituted aryl group having 6 to 12 carbon atoms,
$R_8$ is each independently a substituted or unsubstituted alkylene group having 1 to 9 carbon atoms,
d is an integer of 0 to 20, and
e is an integer of 1 to 500, and
provided that X is not —C(CH$_3$)$_2$—when both c are 0.

2. The curable resin composition according to claim 1, wherein the constitutional unit represented by Formula (2) contains at least one selected from the group consisting of Formulae (7) to (13):

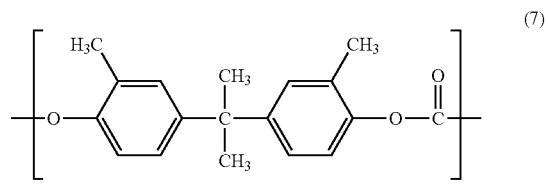

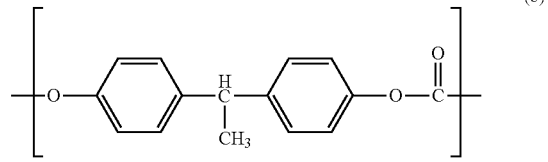

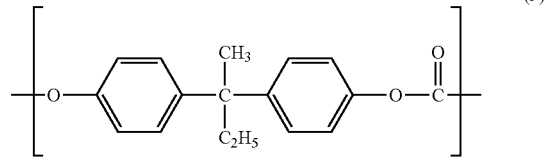

-continued

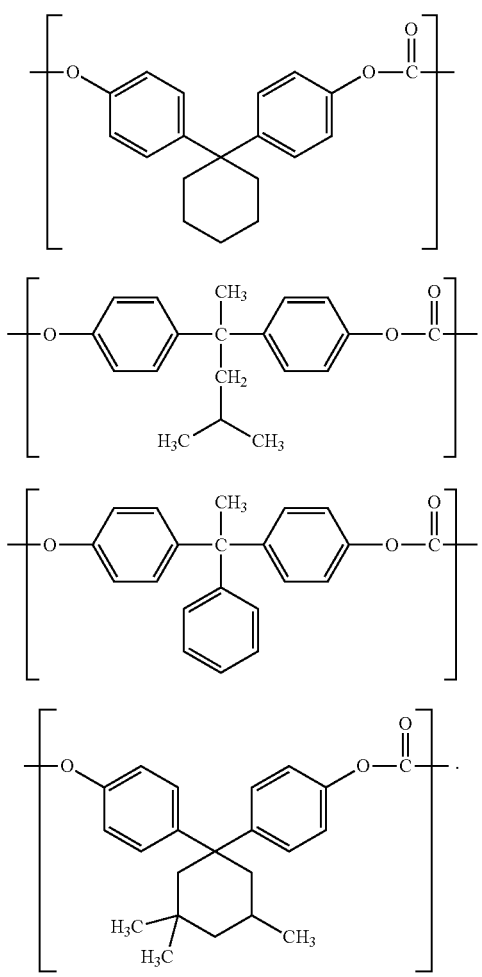

3. The curable resin composition according to claim 1, wherein the constitutional unit represented by Formula (2) is derived from a bisphenol compound.

4. The curable resin composition according to claim 3, wherein the bisphenol compound comprises at least one selected from the group consisting of 2,2-bis(4-hydroxy-3-methylphenyl) propane, 2,2-bis(4-hydroxyphenyl) butane, 2,2-bis(4-hydroxyphenyl)-4-methylpentane, 1,1-bis(4-hydroxyphenyl) ethane, 1,1-bis(4-hydroxyphenyl)cyclohexane, 1,1-bis(4-hydroxyphenyl)-1-phenylmethane, and 1,1-bis(4-hydroxyphenyl)-3,3,5-trimethylcyclohexane.

5. The curable composition according to claim 1, wherein the polycarbonate resin further comprises a constitutional unit derived from bisphenol A represented by the following formula:

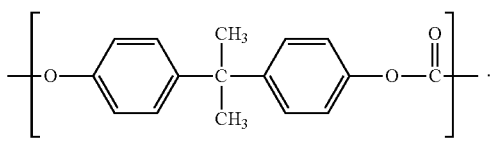

6. The curable resin composition according to claim 1, wherein, in Formula (1),
   A is an isopropenyl,
   $R_2$ is a single bond or an ethylene group, and
   $R_3$ is each independently a hydrogen atom or a benzotriazolyl group.

7. The curable resin composition according to claim 6, wherein the terminal structure having the unsaturated group represented by Formula (1) is derived from 2-[2-hydroxy-5-[2-(methacryloyloxy)ethyl]phenyl]-2H-benzotriazole.

8. The curable resin composition according to claim 1, wherein the styrenic monomer comprises styrene.

9. The curable resin composition according to claim 1, further comprising a radical polymerization initiator.

10. The curable resin composition according to claim 1, wherein the polycarbonate resin has a limiting viscosity of 0.3 to 2.0 dL/g.

11. The curable resin composition according to claim 1, wherein the terminal structure having the unsaturated group represented by Formula (1) is contained in an amount of 0.2 mol % or more with respect to the constitutional unit represented by Formula (2).

12. A molded article formed by curing the curable resin composition according to claim 1.

13. The molded article according to claim 12, being a cast-molded article.

14. A method for producing a molded article, comprising curing the curable resin composition according to claim 1.

15. The curable composition according to claim 2, wherein the polycarbonate resin further comprises a constitutional unit derived from bisphenol A represented by the following formula:

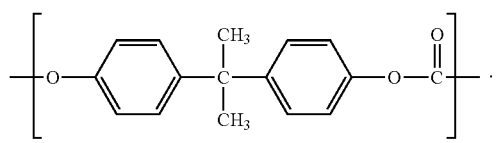

16. The curable resin composition according to claim 2, wherein, in Formula (1),
   A is an isopropenyl group,
   $R_2$ is a single bond or an ethylene group, and
   $R_3$ is each independently a hydrogen atom or a benzotriazolyl group.

17. The curable resin composition according to claim 15, wherein, in Formula (1),
   A is an isopropenyl group,
   $R_2$ is a single bond or an ethylene group, and
   $R_3$ is each independently a hydrogen atom or a benzotriazolyl group.

* * * * *